United States Patent
Hirano et al.

(10) Patent No.: US 10,412,829 B2
(45) Date of Patent: Sep. 10, 2019

(54) NITRIDE SEMICONDUCTOR LIGHT-EMITTING ELEMENT BASE AND MANUFACTURING METHOD THEREOF

(71) Applicants: Soko Kagaku Co., Ltd., Ishikawa (JP); AGC INC., Tokyo (JP)

(72) Inventors: Akira Hirano, Aichi (JP); Ko Aosaki, Tokyo (JP)

(73) Assignees: SOKO KAGAKU CO., LTD., Ishikawa (JP); AGC INC., Tokyo (JP)

( * ) Notice: Subject to any disclaimer, the term of this patent is extended or adjusted under 35 U.S.C. 154(b) by 0 days.

(21) Appl. No.: 15/742,190

(22) PCT Filed: Aug. 2, 2016

(86) PCT No.: PCT/JP2016/072639
§ 371 (c)(1),
(2) Date: Jan. 5, 2018

(87) PCT Pub. No.: WO2017/022755
PCT Pub. Date: Feb. 9, 2017

(65) Prior Publication Data
US 2018/0199433 A1    Jul. 12, 2018

(30) Foreign Application Priority Data
Aug. 3, 2015   (JP) .................. 2015-153700

(51) Int. Cl.
*H05K 1/11*   (2006.01)
*H05K 1/03*   (2006.01)
(Continued)

(52) U.S. Cl.
CPC ............ *H05K 1/036* (2013.01); *H01L 33/32* (2013.01); *H01L 33/62* (2013.01); *H05K 1/09* (2013.01);
(Continued)

(58) Field of Classification Search
CPC ......... H01L 33/56; H01L 33/32; H01L 33/62; H01L 2224/14; H01L 2224/16225;
(Continued)

(56) References Cited

U.S. PATENT DOCUMENTS

2006/0138443 A1   6/2006  Fan et al.
2007/0267645 A1   11/2007 Nakata et al.
(Continued)

FOREIGN PATENT DOCUMENTS

JP    2006348088 A    12/2006
JP    2007249148 A    9/2007
(Continued)

OTHER PUBLICATIONS

Nagamatsu, Kentaro et al., "High-efficiency AlGaN-based UV light-emitting diode on laterally overgrown AlN", Journal of Crystal Growth, 2008, 310, pp. 2326-2329.
(Continued)

*Primary Examiner* — Steven T Sawyer
(74) *Attorney, Agent, or Firm* — Haynes Beffel & Wolfeld LLP

(57) ABSTRACT

To prevent degradation of electrical characteristics caused by a resin filled between electrodes in an ultraviolet light-emitting operation, the present invention provides a base 10 that comprises an insulating base material 11 and two or more metal films 12 and 13 that are formed on one side of the insulating base material 11 and electrically separated from each other. The two or more metal films are formed to include an upper surface and a side wall surface that are covered by gold or a platinum group metal, to be capable of mounting thereon one or more nitride semiconductor light-emitting elements and the like, and to have, as a whole, a predetermined planar view shape including two or more electrode pads. On the one side of the base material 11, along
(Continued)

a boundary line between an exposed surface of the base material 11 that is not covered by the metal film 12, 13 and a side wall surface of the metal film 12, 13, at least a first part of the exposed surface of the base material 11 continuous with the boundary line that is sandwiched between two adjacent electrode pads and the side wall surfaces of the metal films 12 and 13 that oppose to each other with the first part interposed therebetween are covered by a fluororesin film 16, and a part of an upper surface of the metal film 12, 13 that composes at least the electrode pad is not covered by the fluororesin film 16.

19 Claims, 16 Drawing Sheets

(51) Int. Cl.
H05K 3/28 (2006.01)
H01L 33/32 (2010.01)
H01L 33/62 (2010.01)
H05K 1/09 (2006.01)
H05K 3/00 (2006.01)
H05K 3/40 (2006.01)
H05K 3/46 (2006.01)
H01L 33/56 (2010.01)

(52) U.S. Cl.
CPC ........... *H05K 1/111* (2013.01); *H05K 3/0044* (2013.01); *H05K 3/28* (2013.01); *H05K 3/4007* (2013.01); *H05K 3/4644* (2013.01); *H01L 33/56* (2013.01); *H01L 2224/16225* (2013.01); *H05K 1/0306* (2013.01); *H05K 2201/0104* (2013.01); *H05K 2201/015* (2013.01); *H05K 2201/10106* (2013.01); *H05K 2201/10674* (2013.01); *H05K 2203/0228* (2013.01); *H05K 2203/0548* (2013.01); *H05K 2203/0759* (2013.01)

(58) Field of Classification Search
CPC ........... H01L 2224/8192; H01L 33/483; H01L 33/486; H01L 33/507; H01L 33/58; H01L 33/54; H01L 33/60
See application file for complete search history.

(56) References Cited

U.S. PATENT DOCUMENTS

| | | | |
|---|---|---|---|
| 2009/0027864 A1* | 1/2009 | Cho | H05K 3/3452 361/767 |
| 2011/0024786 A1* | 2/2011 | Sugiyama | H01L 33/486 257/99 |
| 2013/0119424 A1 | 5/2013 | Kang et al. | |
| 2013/0313695 A1* | 11/2013 | Noichi | H01L 23/49582 257/668 |
| 2015/0028380 A1 | 1/2015 | Masatsugu et al. | |
| 2015/0243856 A1 | 8/2015 | Yamada et al. | |
| 2017/0092817 A1* | 3/2017 | Ikeda | H01L 33/483 |

FOREIGN PATENT DOCUMENTS

| | | |
|---|---|---|
| JP | 2007311707 A | 11/2007 |
| JP | 2012227293 A | 11/2012 |
| JP | 2013106048 A | 5/2013 |
| JP | 2015023265 A | 2/2015 |
| JP | 2015503840 A | 2/2015 |
| WO | 2013096431 A1 | 6/2013 |
| WO | 2014178288 A1 | 11/2014 |

OTHER PUBLICATIONS

Sumiya, Shigeaki et al., "AlGaN-Based Deep Ultraviolet Light-Emitting Diodes Grown on Epitaxial AlN/Sapphire Templates," Japanese Journal of Applied Physics, vol. 47, No. 1, 2008, pp. 43-46.

* cited by examiner

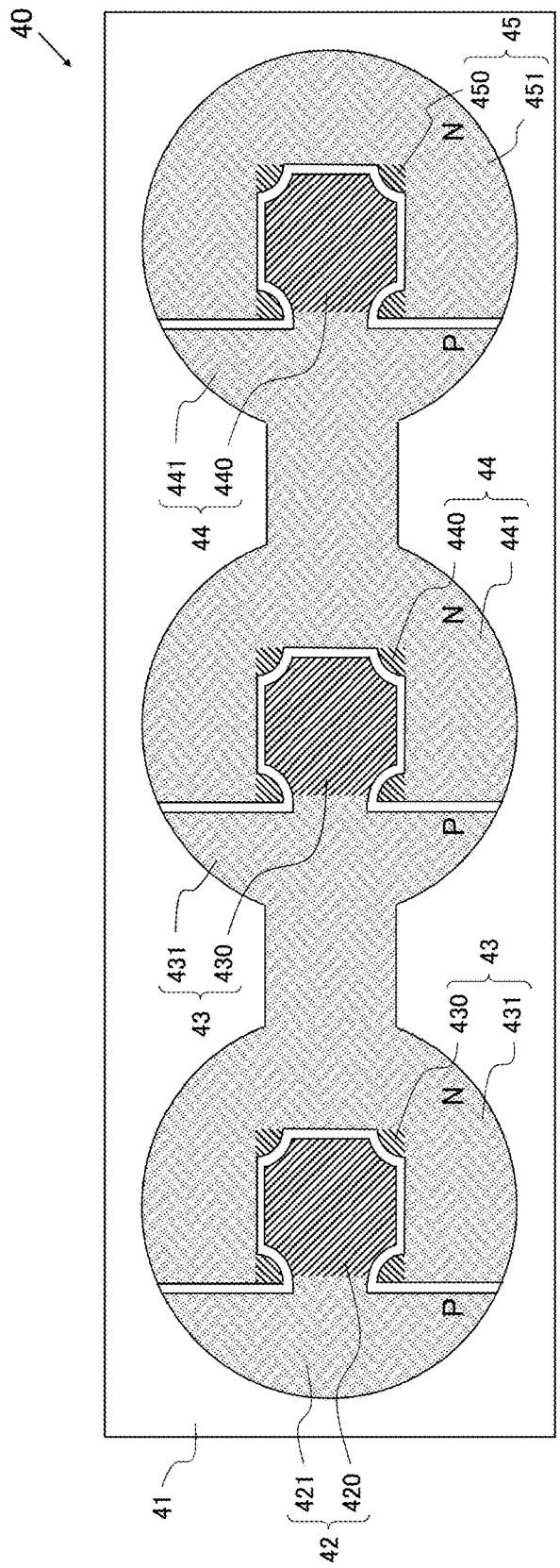
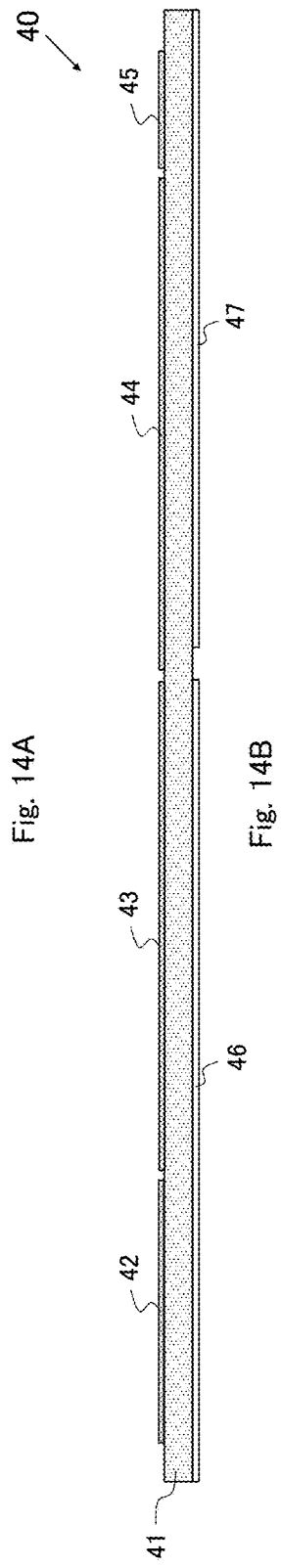
Fig. 14A
Fig. 14B

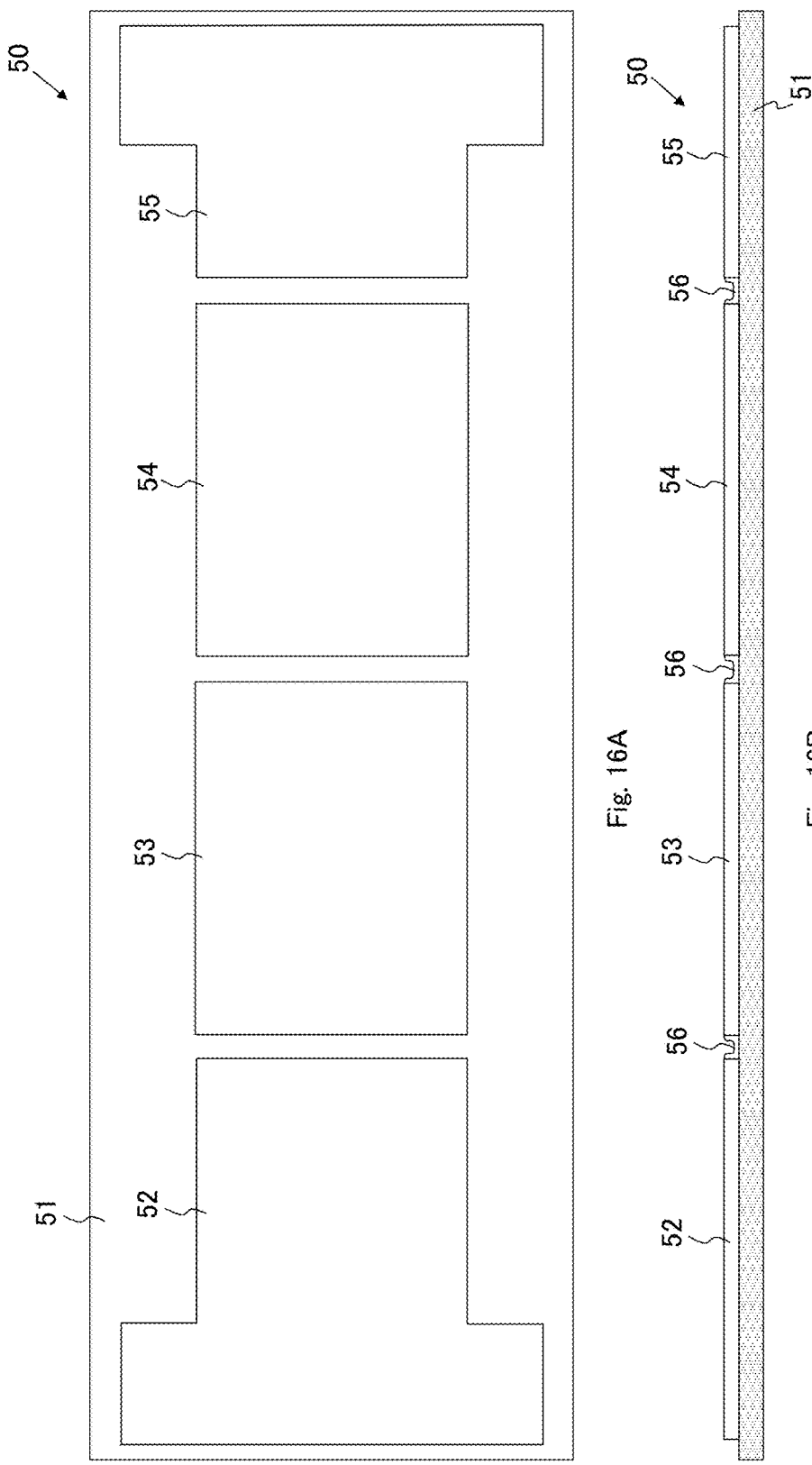

NITRIDE SEMICONDUCTOR LIGHT-EMITTING ELEMENT BASE AND MANUFACTURING METHOD THEREOF

TECHNICAL FIELD

The present invention relates to a base such as a submount and a wiring board used for mounting a nitride semiconductor light-emitting element, particularly a nitride semiconductor ultraviolet light-emitting element having an emission center wavelength of approximately 365 nm or less, and a manufacturing method thereof.

BACKGROUND ART

Conventionally, there are a large number of nitride semiconductor light-emitting elements such as LEDs (light-emitting diodes) or semiconductor lasers in which a light-emitting structure constituted by a plurality of nitride semiconductor layers is formed on a substrate such as sapphire by epitaxial growth (for example, see the following Non-Patent Documents 1 and 2). The nitride semiconductor layer is represented by the general formula $Al_{1-x-y}Ga_xIn_yN$ ($0 \leq x \leq 1$, $0 \leq y \leq 1$, $0 \leq x+y \leq 1$).

The light-emitting element structure has a double hetero-structure in which an active layer is interposed between an n-type nitride semiconductor layer and a p-type nitride semiconductor layer. The active layer is constituted by a nitride semiconductor layer having a single-quantum-well (SQW) structure or a multi-quantum-well (MQW) structure. When the active layer is an AlGaN based semiconductor layer, it is possible to regulate a band gap energy within a range, lower and upper limits of which are band gap energies that can be taken by GaN and AlN respectively (approximately 3.4 eV and approximately 6.2 eV) by adjusting an AlN molar fraction (also referred to as an Al composition ratio). Thus, it is possible to obtain an ultraviolet light-emitting element having an emission wavelength of approximately 200 nm to 365 nm. Specifically, as a forward current flows from the p-type nitride semiconductor layer to the n-type nitride semiconductor layer, light emission equivalent to the band gap energy occurs in the active layer.

Flip-chip mounting has been generally employed as a way of mounting a nitride semiconductor ultraviolet light-emitting element (for example, see FIG. 4 and the like in the following Patent Document 1). In the flip-chip mounting, light emission from an active layer is transmitted through an AlGaN based nitride semiconductor, a sapphire substrate, and the like having a larger band gap energy than the active layer to be extracted from the element. Consequently, in the flip-chip mounting, the sapphire substrate is faced upward, p- and n-electrode surfaces formed on the upper surface of a chip are faced downward, and the electrode surfaces on the chip are electrically and physically bonded via metal bumps formed on the electrode surfaces to electrode pads on a package component such as a sub mount.

In the flip-chip mounting disclosed in the following Patent Document 1, a nitride semiconductor ultraviolet light-emitting element in a bare chip state is mounted on a submount. Meanwhile, an LED illumination device, a liquid crystal backlight, and the like often employ a way of mounting light-emitting elements using a COB (chip on board) technique in which a plurality of bare chips are mounted on a submount or a wiring board and a plurality of light-emitting elements are connected in serial, parallel, or serial-parallel (combinations of serial and parallel connections) (for example, see the following Patent Documents 2 and 3).

In addition, in a printed wiring board for surface-mounting not only light-emitting elements but also electronic components, wiring patterns composed of a conductive material such as a metal are formed on an insulating board, and terminals or electrodes of surface-mounted components are physically or electrically connected to a part of the wiring pattern on which the electronic components or the like are surface-mounted (referred to as "pad", "land", or the like), so that the electronic components are surface-mounted on the printed wiring board. In general, a solder resist layer is formed on a surface of the board having the wiring patterns formed thereon for the purpose of preventing a short-circuit between the wiring patterns caused by a solder. A solder resist that is colored white is used for a submount or a wiring board for mounting a light-emitting element thereon, for the purpose of preventing the short-circuit described above and improving light emission characteristics (for example, see the following Patent Document 4).

Generally, as disclosed in FIGS. 4, 6, 7, and the like in the following Patent Document 5 or FIGS. 2, 4, 6, and the like in the following Patent document 6, the nitride semiconductor ultraviolet light-emitting element is practically used in a state of being sealed with an ultraviolet-transmitting resin such as a fluorine-based resin or a silicone resin. The sealing resin protects an ultraviolet light-emitting element within the resin from the outside atmosphere and prevents degradation of the light-emitting element caused by the entrance of water, oxidization, or the like. Moreover, the sealing resin is sometimes provided as a refractive-index reducing material that reduces the light reflection loss caused by the refractive index difference between a collecting lens and the ultraviolet light-emitting element or the refractive index difference between the ultraviolet irradiation space and the ultraviolet light-emitting element to improve light extraction efficiency. In addition, the surface of the sealing resin may be formed in a light-collecting curved surface such as a spherical surface, for the purpose of improving the irradiation efficiency.

PRIOR ART DOCUMENTS

Patent Documents

Patent Document 1: WO2014/178288 A
Patent Document 2: JP 2015-023265 A
Patent Document 3: JP 2015-503840 A
Patent Document 4: JP 2007-249148 A
Patent Document 5: JP 2007-311707 A
Patent Document 6: US 2006/0,138,443 A
Patent Document 7: JP 2006-348088 A

Non-Patent Documents

Non-Patent Document 1: Kentaro Nagamatsu, et al., "High-efficiency AlGaN-based UV light-emitting diode on laterally overgrown AlN", Journal of Crystal Growth, 2008, 310, pp. 2326-2329

Non-Patent Document 2: Shigeaki Sumiya, et al., "AlGaN-Based Deep Ultraviolet Light-Emitting Diodes Grown on Epitaxial AlN/Sapphire Templates", Japanese Journal of Applied Physics, Vol. 47, No. 1, 2008, pp. 43-46

SUMMARY OF THE INVENTION

Problems to be Solved by the Invention

As described above, it has been proposed to use a fluorine-based resin, a silicone resin, or the like as a resin for sealing an ultraviolet light-emitting element. However, it has been found that if the silicone resin is exposed to a large amount of high energy ultraviolet light, degradation of the silicone resin is prompted. In particular, there has been demanded higher output of the ultraviolet light-emitting element and thus the degradation of the sealing resin caused by exposure to the ultraviolet light tends to be accelerated. Additionally, the amount of generated heat is also increased by the increase in consumption power according to higher output, which also leads to the degradation of the sealing resin.

While it has been known that the fluorine-based resin has high thermal resistance and high ultraviolet resistance, a general fluororesin such as polytetrafluoroethylene is opaque. The fluorine-based resin has rectilinear and rigid polymer chains and is easily crystallized. Consequently, there are a crystalline part and an amorphous part in a mixed manner in the fluororesin. Light scatters on the interface between the crystalline part and the amorphous part and thus the fluororesin is opaque.

For example, it is proposed in Patent Document 7 that an amorphous (non-crystalline) fluororesin is used as the sealing resin of an ultraviolet light-emitting element for the purpose of enhancing the transparency of the fluororesin to ultraviolet light. Examples of the amorphous fluororesin include an amorphized polymer alloy obtained by copolymerizing a fluororesin of a crystalline polymer, a copolymer of perfluoro dioxole (Trade Name "Teflon® AF" by Du Pont), and a cyclized polymer of perfluoro butenyl vinyl ether (Trade Name "CYTOP®" by Asahi Glass Co., Ltd.). The fluororesin of a cyclized polymer has a cyclic main chain structure and thus is easily amorphized. As a result, the fluororesin has high transparency.

There are roughly two types of the amorphous fluororesin: a bonding fluororesin having a functional group bondable to metal and a non-bonding fluororesin having a functional group that is hard to bond to metal. If the bonding fluororesin is used for covering a surface of a base on which an LED chip is mounted and the LED chip, it is possible to increase the bondability of a metal surface of the base or the like and the fluororesin. In the present invention, the term "bonding" to metal includes the meaning of affinity for a metal interface. Similarly, the term "non-bonding" to metal includes the meaning of non-affinity for a metal interface.

Meanwhile, it is reported in Patent Document 1 that in a case where a bonding amorphous fluororesin with reactive functional groups including a terminal functional group bondable to metal is used for covering pad electrodes of an ultraviolet light-emitting element in a nitride semiconductor, when the ultraviolet light-emitting element emits ultraviolet light by applying a forward voltage between metal electrode wires connected to a p-electrode and an n-electrode of the ultraviolet light-emitting element, respectively, electrical characteristics of the ultraviolet light-emitting element are degraded. Specifically, it is confirmed that a resistive leakage current path is formed between the p-electrode and the n-electrode of the ultraviolet light-emitting element. According to Patent Document 1, it is assumed that if the amorphous fluororesin is a bonding amorphous fluororesin, when high energy ultraviolet light is irradiated to the bonding amorphous fluororesin, the reactive terminal functional groups are separated from the bonding amorphous fluororesin to form radicals by a photochemical reaction, the radicals are coordinately bonded to metal atoms constituting the pad electrodes, and the metal atoms are separated from the pad electrodes. In addition, it is considered that an electric field is applied between the pad electrodes during light emission and the metal atoms migrate, so that the resistive leakage current path is formed and a short-circuit is generated between the p-electrode and the n-electrode of the ultraviolet light-emitting element.

The short-circuit between the pad electrodes of the ultraviolet light-emitting element caused by the migration of metal atoms composing the pad electrodes is problematic on the light-emitting element side. Also between metal wiring patterns on a base such as a submount and a wiring board for mounting the light-emitting element thereon, in an environment in which exposure to high energy ultraviolet light may occur, if a solder material for joining the pad electrodes on the light-emitting element and metal wires (pads) on the base contains a metal that is easily migrated as compared to gold or a platinum group metal, such as tin, a short-circuit caused by migration of metal atoms composing the solder material may occur.

In addition, the resin composition that is generally used as a solder resist contains an epoxy resin as a main component, and is carbonized by being exposed to high energy ultraviolet light. Consequently, if the generally available solder resist is used in the submount, the wiring board, or the like for mounting the ultraviolet light-emitting element thereon, in the environment in which the base is possibly exposed to high energy ultraviolet light, a short-circuit caused by the carbonization may occur between the metal wiring patterns on the base. Moreover, the epoxy resin is bondable to a surface of the metal wiring pattern, and thus it is considered that the same short-circuit as the short-circuit between the electrodes in the bonding amorphous fluororesin may occur between the metal wiring patterns on the submount, the wiring board, or the like.

The present invention has been achieved in view of the above problems, and an object of the invention is to provide an ultraviolet light-emitting device that prevents a short-circuit between metal wires on a base in an ultraviolet light-emitting operation and that has high quality and high reliability.

Means for Solving the Problem

To achieve the above object, according to a first aspect of the present invention, there is provided a base for chip-on-board mounting including flip-chip mounting or for surface-mounting. The base comprises an insulating base material and two or more metal films that are formed on one side of the insulating base material and electrically separated from each other. At least a surface layer part that is exposed on a surface of the one side of the insulating base material is composed of a material that is not degraded by being exposed to ultraviolet light. The two or more metal films are formed to include an upper surface and a side wall surface that are covered by gold or a platinum group metal, to be capable of mounting thereon one or more nitride semiconductor light-emitting elements or one or more submounts, each of the submounts being obtained by flip-chip mounting thereon a nitride semiconductor light-emitting element, and to have, as a whole, a predetermined planar view shape including two or more electrode pads. On the one side of the insulating base material, along a boundary line between an exposed surface of the insulating base material that is not covered by each of the two or more metal films and a side wall surface of each of the two or more metal films, at least a first part of the exposed surface of the insulating base material continuous with the boundary line that is sandwiched between two adjacent electrode pads and the side wall surfaces of the two or more metal films that oppose to each other with the first part interposed therebetween are covered by a fluororesin film. A part of an upper surface of each of the two or more metal films that composes at least each of the two or more electrode pads is not covered by the fluororesin film.

According to the base of the first aspect, the upper surfaces of the two or more metal films, that become two or more electrode pads are parts to which terminals (an n-electrode and a p-electrode) of a nitride semiconductor light-emitting element in a chip state or of a submount obtained by flip-chip mounting a nitride semiconductor light-emitting element in a chip state thereon (for easy description, hereinafter conveniently referred to as "mounted element or the like") are actually connected by soldering or the like. Consequently, after the mounted element or the like is mounted on the base, a solder material is present on the electrode pads on the base. When a side wall surface of the metal film that is the electrode pad is not covered by the fluororesin film, the solder material may be adhered to the side wall surface. In the worst case, the solder material may be also adhered to the exposed surface of the insulating base material between the side wall surfaces of the opposing metal films (corresponding to "first part"). When the mounted element or the like is sealed with resin, a sealing resin may be filled between the metal films. In a case where the sealing resin includes a resin that has a terminal functional group bondable to metal, even when a direct short-circuit between adjacent metal films does not occur by the solder material, the resin is exposed to ultraviolet light emitted from the nitride semiconductor light-emitting element and thus migration of metal atoms composing the solder material is induced, so that a short-circuit may occur between the adjacent metal films as a change with time in a light-emitting operation.

Meanwhile, when the solder material is present on the upper surfaces of the electrode pads of the adjacent metal films, the migration path of metal atoms in the solder material on the base is obtained by connecting the side wall surface of each metal film to the exposed surface of the insulating base material between the side wall surfaces. Meanwhile, in the path along the side wall surface of each metal film, the potential on the side wall surface is uniform and thus an electric field is not generated. As the path along the side wall surface is longer, the migration of metal atoms in the path along the side wall surface is hard to generate.

According to the base of the first aspect, the side wall surface of the metal film and the exposed surface of the insulating base material between the side wall surfaces of the opposing metal films are covered by the fluororesin film. The fluororesin film thus functions as a solder resist and can prevent in advance the solder material from being adhered to the side wall surface of the metal film and the exposed surface of the insulating base material between the side wall surfaces of the opposing metal films (corresponding to "first part"). That is, the solder material stays on the upper surface of the electrode pad where migration of metal atoms is hard to generate, and thus it is possible to reduce the migration of metal atoms in the solder material, thus significantly reducing the possibility of a short-circuit between the adjacent metal films.

In addition, the fluororesin film has high ultraviolet resistance and thus is hard to deteriorate even if ultraviolet light enters between the side wall surfaces of the opposing metal films. Consequently, it is possible to keep high reliability of a light-emitting device or a light-emitting module obtained by mounting an ultraviolet light-emitting element on the base of the first aspect as compared to a case of using a resin other than the fluororesin as a solder resist.

In addition, the surface layer part of the insulating base material has high ultraviolet resistance and thus is hard to deteriorate even if ultraviolet light enters the one side of the insulating base material. Consequently, it is possible to keep high reliability of a light-emitting device or a light-emitting module obtained by mounting an ultraviolet light-emitting element on the base of the first aspect.

Moreover, according to the base of the first aspect, the upper surface and the side wall surface of the metal film are covered by gold or a platinum group metal that has a high melting point and small ionization tendency, and is hard to migrate, and thus it is possible to surely reduce the possibility of the short-circuit between the adjacent metal films caused by the migration of metal atoms composing the metal film.

In addition, in the base of the first aspect, paired electrode pads of the two or more electrodes are preferably formed on a surface of the insulating base material so as to be electrically and physically connected to an n-electrode and a p-electrode of one of the one or more nitride semiconductor light-emitting elements or one of the one or more submounts, respectively. In such a preferable aspect, when the base is a submount for flip-chip mounting a nitride semiconductor light-emitting element thereon, it is possible to achieve a light-emitting device having a light-emitting element mounted thereon by electrically connecting paired metal films respectively corresponding to the paired electrode pads to terminals for external connection. When the base is a submount or a wiring board for mounting (flip-chip mounting or COB mounting) a plurality of the nitride semiconductor light-emitting elements thereon, a pattern of the metal films (a planar view shape) of paired electrode pads for a light-emitting element and paired electrode pads for another light-emitting element is formed in a manner that the light-emitting elements are connected in serial or parallel. As a result, it is possible to achieve a light-emitting device having the nitride semiconductor light-emitting elements mounted thereon, where the nitride semiconductor light-emitting elements are connected, as a whole, in serial, parallel, or serial-parallel. When the base is a wiring board for surface-mounting a plurality of the submounts thereon, the pattern of the metal films is formed similarly, so that it is possible to achieve a light-emitting device in which the nitride semiconductor light-emitting elements are connected, as a whole, in serial, parallel, or serial-parallel.

In addition, in the base of the first aspect, on an exposed surface of the insulating base material exposed between paired metal films respectively including paired electrode pads of the two or more electrode pads, at least a second part in which a distance between the paired metal films is equal to or less than a maximum value of a spaced distance between the paired electrode pads and the side wall surfaces of the paired metal films that oppose to each other with the second part interposed therebetween are preferably covered by the fluororesin film. With such a preferable aspect, it is possible to effectively prevent an accidental short-circuit between the adjacent metal films caused by the solder material in a part that is not related with soldering.

In addition, in the base of the first aspect, the fluororesin film preferably includes an amorphous fluororesin composed of a polymer or a copolymer having a fluorine-containing aliphatic cyclic structure as a structural unit.

Moreover, in the base of the first aspect, the fluororesin film preferably includes a first type fluororesin where a terminal functional group of a polymer or a copolymer composing a fluororesin is a non-reactive terminal functional group that is not bondable to metal. Such a preferable aspect enables the migration of metal atoms in the solder material or the metal film to be reduced more surely.

In addition, in the base of the first aspect, the fluororesin film is preferably constituted by a laminated film of two or more layers, a resin film of a first layer of the laminated film that contacts each of the two or more metal films preferably includes a second type fluororesin where a terminal functional group of a polymer or a copolymer composing a fluororesin is a reactive terminal functional group bondable to metal, and a resin film of each of second and subsequent layers of the laminated film preferably includes a first type fluororesin where a terminal functional group of a polymer or a copolymer composing a fluororesin is a non-reactive terminal functional group that is not bondable to metal. With such a preferable aspect, it is possible to reduce an influence of the reactive terminal functional group upon the migration of metal atoms, and at the same time, it is possible to increase bonding between the fluororesin film and the side wall surface of the metal film, and the fluororesin film is hard to peel off.

In addition, according to a base of a second aspect, in the base of the first aspect, a second fluororesin film that includes a second type fluororesin where a terminal functional group of a polymer or a copolymer composing a fluororesin is a reactive terminal functional group bondable to metal is formed as a primer film of the fluororesin film on an upper surface of an outer circumferential edge part of the base. In the base of the second aspect, the primer film functions as a binder between the fluororesin film and a surface of the base (the one side of the insulating base material or the surface of the metal film). It is thus possible to prevent the fluororesin film from being damaged or the like at an end part of the base and the formed fluororesin film from being peeled off.

To achieve the above object, the present invention provides a wiring board body that is configured by arranging a plurality of the bases of the first or second aspect in a matrix and integrating the bases as a plate. The two or more metal films for each of the bases are periodically arranged in a matrix on an insulating base material plate that is the insulating base material, and a cutting region is provided in a lattice shape on a boundary line between adjacent unit sections each of which corresponds to one of the bases on the insulating base material plate.

In the wiring board body of the above aspect, a plurality of bases can be obtained simultaneously by cutting or dividing the insulating base material plate along the cutting region.

In addition, in the wiring board body of the above aspect, it is preferable that the fluororesin film is not formed in the cutting region. With such a preferable aspect, when the insulating base material plate is cut or divided along the cutting region, it is possible to prevent an end part of the fluororesin film from being damaged or the like and the formed fluororesin film from being peeled off from the surface of the base (the one side of the insulating base material or the surface of the metal film).

To achieve the above object, the present invention provides a manufacturing method of the base of the first or second aspect. The manufacturing method comprises a first process of forming the two or more metal films on the one side of the insulating base material and a second process in which on the one side of the insulating base material, along a boundary line between an exposed surface of the insulating base material that is not covered by each of the two or more metal films and a side wall surface of each of the two or more metal films, at least a first part of the exposed surface of the insulating base material continuous with the boundary line that is sandwiched between two adjacent electrode pads and the side wall surfaces of the two or more metal films that oppose to each other with the first part interposed therebetween are covered by a fluororesin film.

In addition, in the manufacturing method of the first aspect, the second process preferably includes forming a first mask material that blocks formation of the fluororesin film on a part of an upper surface of each of the two or more metal films that composes at least each of the two or more electrode pads, applying a coating liquid that contains a fluororesin composing the fluororesin film on the one side of the insulating base material having the first mask material formed thereon, and drying the coating liquid to form a film of the fluororesin, and then removing the first mask material and a part of the film of the fluororesin formed on the first mask material. In particular, the first mask material is preferably composed of a resin composition that does not contain a fluororesin, and the second process more preferably includes dissolving the first mask material by an organic solvent that does not dissolve the fluororesin film and removing the first mask material.

Moreover, in the manufacturing method of the first aspect, the second process preferably includes applying a coating liquid that contains a fluororesin composing the fluororesin film on the one side of the insulating base material, and drying the coating liquid to form a film of the fluororesin, and then removing a part of the film of the fluororesin formed on an upper surface of each of the two or more metal films by polishing.

With the manufacturing method of the first aspect, it is possible to produce the base of the first or second aspect.

In addition, as a second aspect of the manufacturing method, in the manufacturing method of the first aspect, the first process includes periodically arranging the two or more metal films for each of the bases in a matrix on an insulating base material plate that is the insulating base material, and the second process includes forming a second mask material that blocks formation of the fluororesin film on a cutting region formed in a lattice shape and provided on a boundary line between adjacent unit sections each of which corresponds to one of the bases on the insulating base material plate, applying a coating liquid that contains a fluororesin composing the fluororesin film on the one side of the insulating base material having the second mask material formed thereon, and drying the coating liquid to form a film of the fluororesin, and then removing the second mask material and a part of the film of the fluororesin formed on the second mask material.

In addition, as a third aspect of the manufacturing method, in the manufacturing method of the first aspect, the first process includes periodically arranging the two or more metal films for each of the bases in a matrix on an insulating base material plate that is the insulating base material, and the second process includes forming a second mask material that blocks formation of the fluororesin film at least on a cutting region formed in a lattice shape and provided on a boundary line between adjacent unit sections each of which corresponds to one of the bases on the insulating base material plate and a part of an upper surface of each of the two or more metal films that composes at least each of the two or more electrode pads, applying a coating liquid that contains a fluororesin composing the fluororesin film on the one side of the insulating base material having the second mask material formed thereon, and drying the coating liquid to form a film of the fluororesin, and then removing the second mask material and a part of the film of the fluororesin formed on the second mask material.

Moreover, in the manufacturing method of the second or third aspect, the second mask material is preferably composed of a resin composition that does not contain a fluororesin, and the second process preferably includes dissolving the second mask material by an organic solvent that does not dissolve the fluororesin film and removing the second mask material.

In addition, as a fourth aspect of the manufacturing method, in the manufacturing method of the first to third aspect, the first process includes periodically arranging the two or more metal films for each of the bases in a matrix on an insulating base material plate that is the insulating base material, and the manufacturing method further comprises, between the first process and the second process, forming a second fluororesin film that includes a second type fluororesin where a terminal functional group of a polymer or a copolymer composing a fluororesin is a reactive terminal functional group bondable to metal as a primer film of the fluororesin film on the cutting region and a side region of the cutting region or the side region of the cutting region.

The manufacturing method of the second to fourth aspects further comprises, after the second process, cutting or dividing the insulating base material plate along the cutting region into each of the bases.

With the manufacturing method of the second to fourth aspects, it is possible to produce the wiring board body of the above aspects and it is possible to simultaneously produce a plurality of the bases of the first or second aspect. In particular, with the manufacturing method of the fourth aspect, it is possible to simultaneously produce the bases of the second aspect.

With the manufacturing method of the second or third aspect, when the insulating base material plate is cut or divided along the cutting region, it is possible to prevent an end part of the fluororesin film from being damaged or the like and the formed fluororesin film from being peeled off from the surface of the base (the one side of the insulating base material or the surface of the metal film).

Effect of the Invention

With the base, the wiring board body, or the manufacturing method of a base according to the above aspects, it is possible to achieve an ultraviolet light-emitting device that prevents degradation as a change with time in an ultraviolet light-emitting operation, that is, a short-circuit between adjacent metal films on a surface of a base, and that has high quality and high reliability by mounting a nitride semiconductor ultraviolet light-emitting element in a chip state on the base, a base obtained by cutting or dividing the wiring board body, or a base produced by the manufacturing method of a base.

BRIEF DESCRIPTION OF THE DRAWINGS

FIG. 14A is a plan view schematically showing a planar view shape of a submount according to a fourth embodiment of the present invention.

FIG. 14B is a cross-sectional view showing a cross-sectional shape of the submount according to the fourth embodiment of the present invention.

FIG. 16A is a plan view schematically showing a planar view shape of a wiring board according to a fifth embodiment of the present invention.

FIG. 16B is a cross-sectional view schematically showing a cross-sectional shape of the wiring board according to the fifth embodiment of the present invention.

DESCRIPTION OF EMBODIMENT

Figure 1:
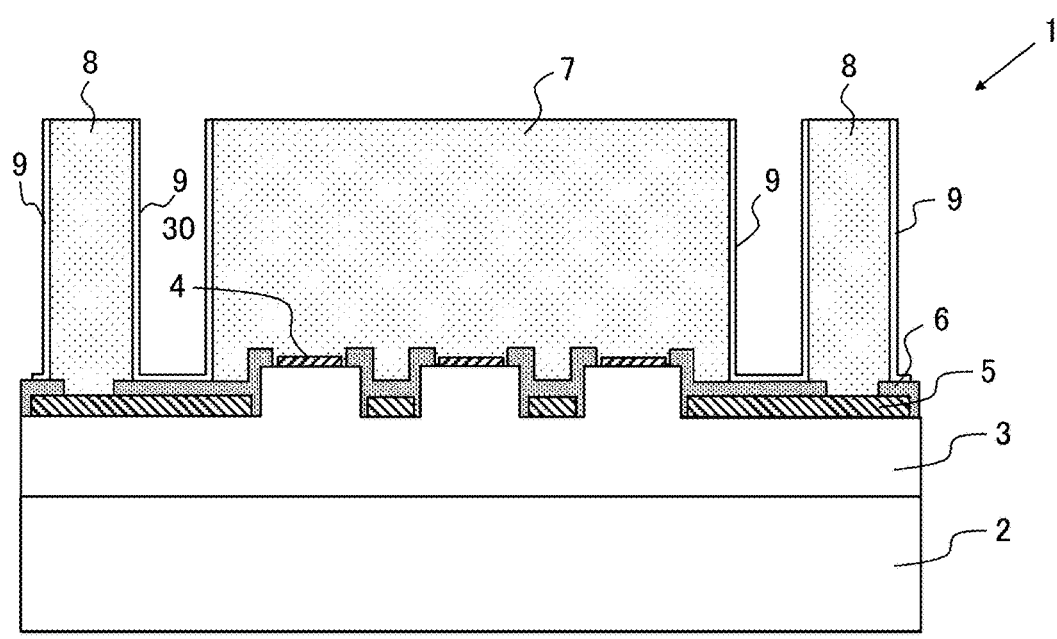
FIG. 1 is a cross-sectional view schematically showing an example of a schematic element structure of a nitride semiconductor ultraviolet light-emitting element mounted on a submount according to the present invention.

Embodiments of a base, a wiring board body, and a manufacturing method of a base according to the present invention are described with reference to the drawings. For easy understanding of the description, an essential part is emphasized to schematically illustrate invention contents in the drawings used in the following description, so that a dimensional ratio of each component does not correspond to a dimensional ratio of an actual element and a component actually to be used. In the following description, the base and the manufacturing method of the base according to the present invention are appropriately referred to as "present base" and "present manufacturing method", and the wiring board body according to the present invention is simply referred to as "wiring board body". In the present specification, the present base is a package including a submount and a wiring board to be described below.

In the present specification, the term "submount" means a type of the board on which a nitride semiconductor light-emitting element in a chip state is mounted. In addition, the term "submount" means one embodiment of a package in which a metal wiring pattern for electrically connecting to an electrode of the light-emitting element is formed on a surface of an insulating base material and the light-emitting element is mounted on the submount to establish the electrical connection, so that a light-emitting device or a light-emitting module is configured. The number of light-emitting elements, in a chip state, mounted on the submount is not limited to one and a plurality of light-emitting elements in a chip state may be mounted on the submount. It may be configured that in addition to the light-emitting elements in a chip state, other electrical circuit components including a diode that is not a light-emitting element are mounted on the submount.

The term "wiring board" has the same meaning as "printed wiring board" defined by Japanese Industrial Standards (JIS-C-5603). The term "wiring board" means one embodiment of a package in which metal wiring patterns for electrically connecting to terminals of a plurality of electrical circuit components including a nitride semiconductor light-emitting element in a chip state are formed on a surface of an insulating base material and the components are mounted on the wiring board to establish the electrical connection, so that a predetermined electrical circuit is configured. In the present embodiment, the electrical circuit components include a nitride semiconductor light-emitting element in a chip state, a submount having the nitride semiconductor light-emitting element in a chip state mounted thereon, and other electrical circuit components. Any one or more of these components are actually mounted as the electrical circuit components.

In the present specification, the nitride semiconductor light-emitting element in a chip state is an element obtained by dividing a nitride semiconductor wafer formed by arranging a plurality of nitride semiconductor light-emitting elements in a matrix into each of nitride semiconductor light-emitting elements, that is, a so-called bare chip. In the present application, when simply referred to as "nitride semiconductor light-emitting element", it means a nitride semiconductor light-emitting element in a chip state. In the following embodiments, descriptions will be given below on the assumption that the nitride semiconductor light-emitting element (hereinafter, simply referred to as "light-emitting element") is an ultraviolet light-emitting diode having a center emission wavelength of 365 nm or less.

First Embodiment

As an embodiment of the present base, a submount for flip-chip mounting a nitride semiconductor light-emitting element thereon is described.

Before the submount is described, a light-emitting element mounted on the submount is briefly described.

As shown in FIG. 1, a light-emitting element 1 is configured to include a template 2, a semiconductor laminated portion 3, a p-electrode 4, an n-electrode 5, a protective insulating film 6, a first plated electrode 7, a second plated electrode 8, and a fluororesin film 9. FIG. 1 is a cross-sectional view vertical to a surface of the template 2, taken along a line A-A' in a plan view of FIG. 2.

The template 2 is formed by growing an AlN layer and an AlGaN layer on, for example, a sapphire (0001) substrate, and is configured to be capable of transmitting ultraviolet light emission from an active layer. The semiconductor laminated portion 3 is formed on the template 2 and includes a mesa part including an n-type semiconductor layer, the active layer, and a p-type semiconductor layer. The n-type semiconductor layer is exposed on parts of the semiconductor laminated portion 3 other than the mesa part. The n-type semiconductor layer is constituted by one or more n-type AlGaN layers, and is configured to be capable of transmitting ultraviolet light emission from the active layer. The active layer has, for example, a single layer quantum well structure or a multi quantum well structure. The p-type semiconductor layer is constituted by one or more p-type AlGaN layers or one or more p-type GaN layers. The p-electrode 4 is constituted by one or more metal films, formed on an upper surface of the p-type semiconductor layer, and electrically connected to the p-type semiconductor layer. The n-electrode 5 is constituted by one or more metal films, formed on an exposed surface of the n-type semiconductor layer, and electrically connected to the n-type semiconductor layer. The protective insulating film 6 is formed to cover upper and side surfaces of the mesa part of the semiconductor laminated portion 3 and the exposed surface of the n-type semiconductor layer of the semiconductor laminated portion 3. The protective insulating film 6 has openings for exposing at least a part of the upper surface of the p-type semiconductor layer and a part of the exposed surface of the n-type semiconductor layer.

Figure 2:
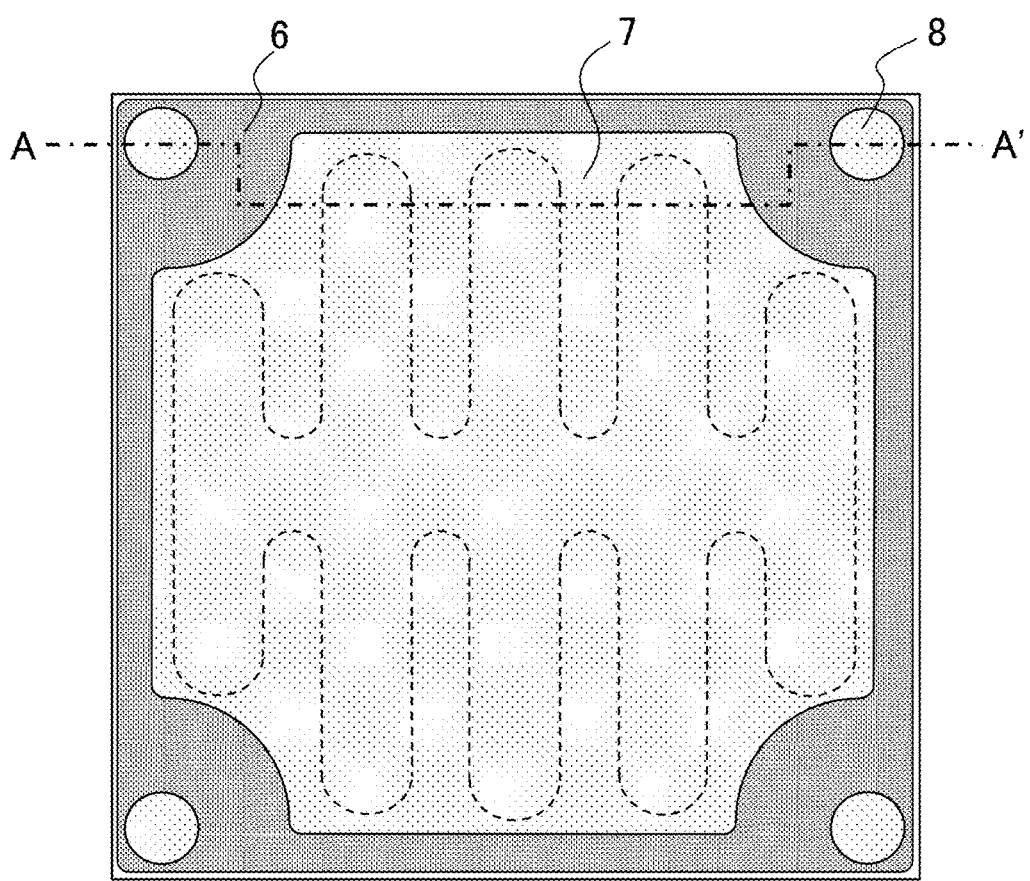
FIG. 2 is a plan view schematically showing an example of top view shapes of first and second plated electrodes of the nitride semiconductor ultraviolet light-emitting element mounted on the submount according to the present invention.

The first plated electrode 7 covers the upper and side surfaces of the mesa part and a part of an outside region of the mesa part with the protective insulating film 6 being interposed between the first plated electrode 7 and the mesa part, and is electrically connected to the p-electrode 4 via the opening of the protective insulating film 6. The second plated electrode 8 is electrically connected to the n-electrode 5 via the opening of the protective insulating film 6 in another part of the outside region of the mesa part. Each of the first and second plated electrodes 7 and 8 is constituted by, as an example, a main body part formed by electrolytic plating with copper and a surface plated part that is constituted by one or more metal layers and includes an outermost surface that covers upper and side surfaces of the main body plated part and is formed by electroless plating with gold. The first and second plated electrodes 7 and 8 are spaced apart from each other by, as an example, 75 μm or more, preferably 100 μm or more, and upper surfaces thereof are planarized to have the same height. The height of the first and second plated electrodes 7 and 8 with reference to the protective insulating film 6 is, for example, approximately 45 to 100 μm. FIG. 2 shows the top view shapes of the first and second plated electrodes 7 and 8. In FIG. 2, an outer circumferential line of the mesa part of the semiconductor laminated portion 3 is indicated by broken lines.

The fluororesin film 9 covers side wall surfaces of the first and second plated electrodes 7 and 8 and an upper surface of the protective insulating film 6 exposed on the outside region of each of the first and second plated electrodes 7 and 8. A chip circumferential edge part of the light-emitting element 1 does not need to be covered by the fluororesin film 9. The fluororesin film 9 has the same function as a fluororesin film provided in a submount and the same material can be used for the fluororesin film 9 and the fluororesin film in the submount. Consequently, overlapping descriptions of the fluororesin film 9 are omitted.

Figure 3A:
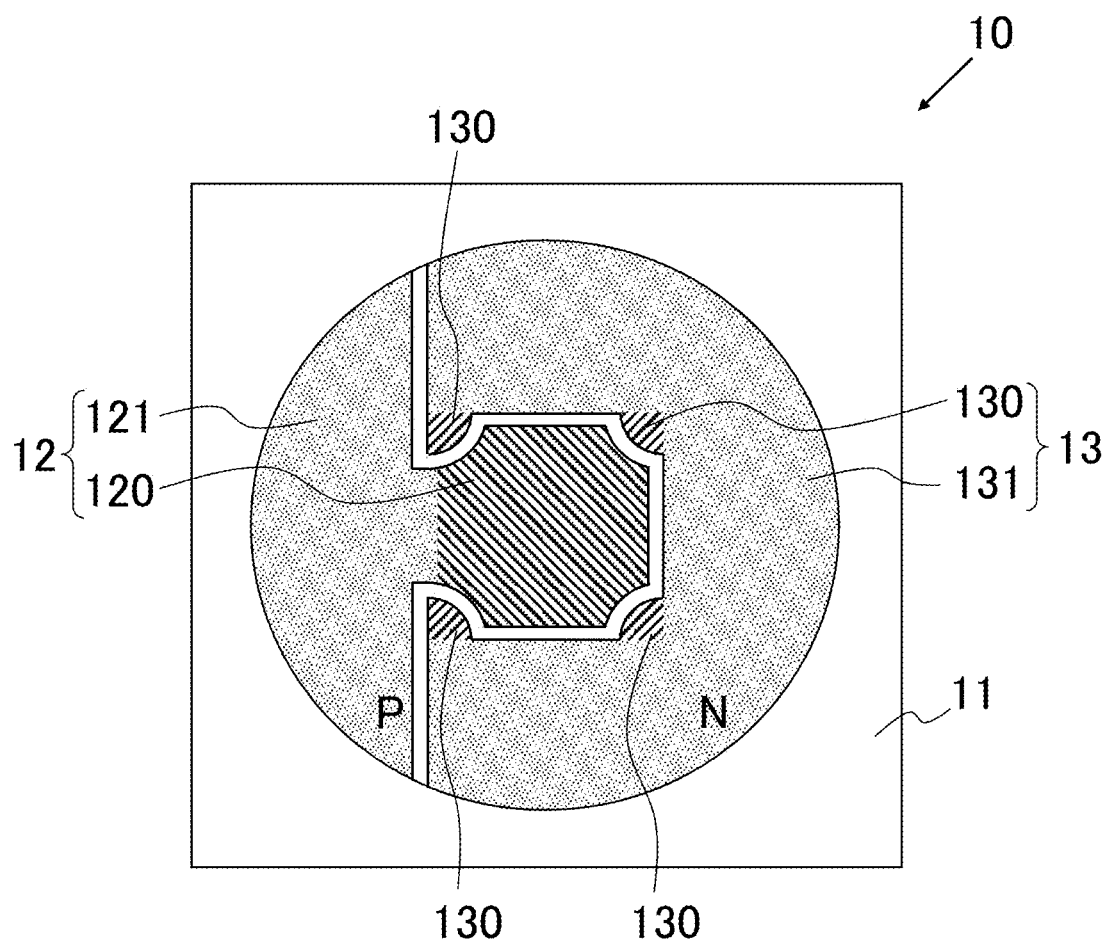
FIG. 3A is a plan view schematically showing a planar view shape of the submount according to first to third embodiments of the present invention.
Figure 3B:
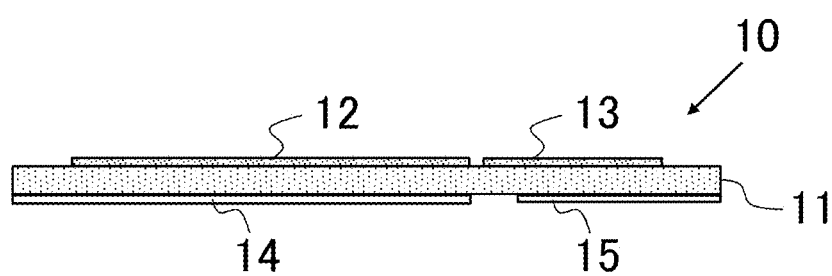
FIG. 3B is a cross-sectional view showing a cross-sectional shape of the submount according to the first to third embodiments of the present invention.

Next, a submount 10 according to the present embodiment is described. FIG. 3A is a plan view showing a planar view shape of the submount 10. FIG. 3B is a cross-sectional view showing the shape of a cross-section that passes through the center of the submount 10 in the plan view and is vertical to a surface of the submount 10. The length of a side of the submount 10 is not limited to particular values as long as there is room to form a sealing resin around one light-emitting element 1 mounted on the submount 10. As an example, the length of a side of the submount 10, which has a square shape in a planar view, is preferably approximately 1.5 to 2 times or more larger than the chip size (the length of a side) of the light-emitting element 1 to be mounted, which has also a square shape. The planar view shape of the submount 10 and the light-emitting element 1 is not limited to a square shape.

The submount 10 includes a plate-like base material 11 (corresponding to "the insulating base material") composed of an insulating material such as an insulating ceramic, and is obtained by forming a first metal electrode wire 12, which is an anode, and a second metal electrode wire 13, which is a cathode, on a surface of the base material 11 and forming lead terminals 14 and 15 on a rear surface of the base material 11. The first and second metal electrode wires 12 and 13 on the surface of the base material 11 are respectively connected to the lead terminals 14 and 15 on the rear surface of the base material 11 via penetration electrodes (not shown) provided in the base material 11. When the submount 10 is mounted on other wiring boards or the like, metals wires on the wiring boards are electrically connected to the lead terminals 14 and 15. In addition, the lead terminals 14 and 15 cover substantially the entire rear surface of the base material 11 to function as a heat sink. The first and second metal electrode wires 12 and 13 correspond to "metal films".

As shown in FIGS. 3A and 3B, the first and second metal electrode wires 12 and 13 are formed on the center part of the base material 11 where the light-emitting element 1 is mounted and a surrounding part thereof, are disposed so as to be spaced apart from each other, and are electrically separated from each other. The first metal electrode wire 12 is constituted by a first electrode pad 120 and a first wire part 121 connected to the first electrode pad 120. The second metal electrode wire 13 is constituted by four second electrode pads 130 and a second wire part 131 connected to the second electrode pads 130. The first electrode pad 120 has a planar view shape that is slightly larger than the planar view shape of the first plated electrode 7 of the light-emitting element 1 and is disposed at the center of the center part of the base material 11. The planar view shape of the second electrode pads 130 and the arrangement thereof are set in a manner that when the light-emitting element 1 is disposed so that the first plated electrode 7 opposes the first electrode pad 120, the four second plated electrodes 8 oppose the four second electrode pads 130, respectively. In FIG. 3A, the first electrode pad 120 and the second electrode pad 130 are hatched.

In the present embodiment, the base material 11 of the submount 10 is composed of an insulating material such as aluminum nitride (AlN) that is not degraded by being exposed to ultraviolet light. While the base material 11 is preferably composed of AlN in view of heat dissipation, the base material 11 may be composed of silicon carbide (SiC), silicon nitride (SiN), or boron nitride (BN), or may be ceramics such as alumina ($Al_2O_3$). In addition, the base material 11 may be composed of not only a solid insulating material but also a sintered body obtained by tightly bonding particles of the insulating material using silica glass as a binder. Moreover, the base material 11 may be composed of a diamond-like carbon (DLC) thin film, an industrial diamond thin film, or the like.

When the lead terminals 14 and 15 are not provided on the rear surface of the base material 11 in the submount 10, the base material 11 does not need to be composed of only the insulating material, and may have a laminated structure of a metal film (for example, Cu and Al) and an insulating layer composed of the above insulating material.

The surface of the base material 11 is preferably a rough surface that has recesses and projections of, for example, approximately 6 μm at a maximum. This is because when the light-emitting element is sealed with a sealing resin to be described later, it is expected that the rough surface achieves an anchor effect for enhancing the adhesion between the sealing resin and the surface of the base material 11. The rough surface of the base material 11 may be formed by performing a roughening process employing, for example, nanoimprinting. Alternatively, if the surface of the base material 11 is unpolished and thus recesses and projections of, for example, approximately 6 μm at a maximum remain thereon, such a rough surface may be used as it is.

As an example, the first and second metal electrode wires 12 and 13 are constituted by a thick copper-plated film and a single-layer or multi-layer surface metal film that covers the surface (an upper surface and a side wall surface) of the thick plated film. The thick plated film may be composed of, other than copper, alloys containing copper as the main component and metal such as lead (Pb), iron (Fe), zinc (Zn), manganese (Mn), nickel (Ni), cobalt (Co), and beryllium (Be). However, the thick plated film is preferably composed of copper because the thick plated film composed of the alloys has lower thermal conductivity. The outermost layer of the surface metal film is composed of a metal having smaller ionization tendency than copper composing the thick plated film (for example, gold (Au), platinum group metals (Ru, Rh, Pd, Os, Ir, Pt, or two or more alloys thereof), or alloys of gold and platinum group metals). As an example, the surface metal film is constituted by three metal films of Ni/Pd/Au in this order from the bottom, and is produced by a well-known electroless plating method. The film thickness of the thick copper-plated film is, for example, approximately 50 to 100 μm. The film thicknesses of the Ni/Pd/Au layers are, for example, 3 to 7.5 μm/50 to 150 nm/50 to 150 nm in this order from the bottom. In the above example, the first and second metal electrode wires 12 and 13 have substantially the same configuration (the multi-layer structure) as the first and second plated electrodes 7 and 8 of the light-emitting element 1 other than the planar view shape.

In the present embodiment, the lead terminals 14 and 15 on the rear surface of the base material 11 are also constituted by a thick copper-plated film and a single-layer or multi-layer surface metal film that covers the surface (the upper surface and the side wall surface) of the thick plated film, similarly to the first and second metal electrode wires 12 and 13 on the surface of the base material 11. In the present embodiment, the configurations of the thick plated film and the surface metal film of the lead terminals 14 and 15 are the same as those of the first and second metal electrode wires 12 and 13, and thus overlapping descriptions thereof are omitted.

Figure 4:
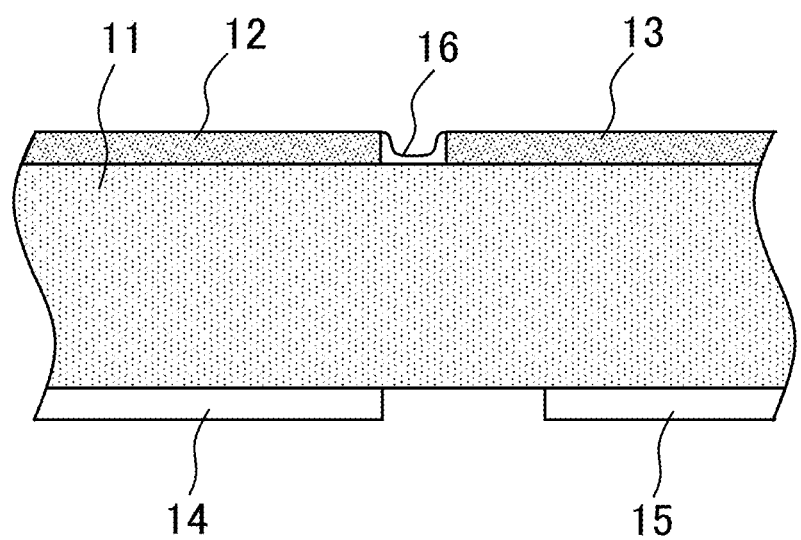
FIG. 4 is a cross-sectional view schematically showing a cross-sectional structure of a main part after a fluororesin film is formed in the submount according to the first to third embodiments of the present invention.

In the present embodiment, as shown in FIG. 4, a fluororesin film 16 is formed to cover side wall surfaces of the first and second metal electrode wires 12 and 13 and the surface of the base material 11 exposed on a bottom surface of a gap part between the first and second metal electrode wires 12 and 13. The fluororesin film 16 is composed of an amorphous fluororesin that is the same as the fluororesin film 9 provided in the light-emitting element 1 and a sealing resin used for resin seal when flip-chip mounting the light-emitting element 1. In general, examples of the amorphous fluororesin include an amorphized polymer alloy obtained by copolymerizing a fluororesin of a crystalline polymer, a copolymer of perfluoro dioxole (Trade Name "Teflon® AF" by Du Pont), and a cyclized polymer of perfluoro butenyl vinyl ether (Trade Name "CYTOP®" by Asahi Glass Co., Ltd.). The amorphous fluororesin used for the fluororesin film 16 in the present embodiment is described in detail in the description of a process of forming the fluororesin film 16.

The fluororesin film 16 does not need to cover all of the side wall surfaces of the first and second metal electrode wires 12 and 13 and the surface of the base material 11 exposed on the bottom surface of the gap part between the first and second metal electrode wires 12 and 13. The fluororesin film 16 preferably covers at least a part of the bottom surface of the gap part between the first electrode pad 120 and each of the four second electrode pads 130 (corresponding to "first part") and the side wall surfaces of the first and second metal electrode wires 12 and 13 opposing to each other with the first part interposed therebetween. In addition to the first part, when there is a part of the bottom surface of the gap part where the spaced distance between the first and second metal electrode wires 12 and 13 is equal to or less than the maximum value of the spaced distance between the first electrode pad 120 and each of the four second electrode pads 130 (corresponding to "second part"), the fluororesin film 16 more preferably covers the second part of the bottom surface of the gap part and the side wall surfaces of the first and second metal electrode wires 12 and 13 opposing to each other with the second part interposed therebetween. In addition, when there is a part of the bottom surface of the gap part where the spaced distance between the first and second metal electrode wires 12 and 13 is, for example, equal to or less than 100 µm per 1 V of voltage applied between the first and second metal electrode wires 12 and 13 ("third part": a part where the spaced distance is equal to or less than 500 µm when the applied voltage is 5 V), the fluororesin film 16 preferably covers the third part of the bottom surface of the gap part and the side wall surfaces of the first and second metal electrode wires 12 and 13 opposing to each other with the third part interposed therebetween.

Next, a manufacturing method of the submount 10 (a present manufacturing method) is described with reference to FIGS. 5 to 11. In the present embodiment, a wiring board body 20 obtained by arranging a plurality of the submounts 10 in a matrix and integrating the submounts 10 into a plate is produced first. The wiring board body 20 is then cut or divided into each of the submounts 10.

In the following description, a base material 21 of the wiring board body 20 (corresponding to "the insulating base material plate") corresponds to the base material 11 of the submount 10. First and second metal electrode wires 22 and 23, lead terminals 24 and 25, and a penetration electrode 27 of the wiring board body 20 are obtained by periodically arranging the first and second metal electrode wires 12 and 13, the lead terminals 14 and 15, and a penetration electrode of the submount 10 in a matrix on the surface and rear surface of the base material 21 and inside of the base material 21, respectively. A fluororesin film 26 of the wiring board body 20 is obtained by periodically arranging the fluororesin film 16 of the submount 10 in a matrix on the surface of the base material 21. Cutting regions RC for cutting or dividing the wiring board body 20 into each of the submounts 10 are defined in a lattice shape on boundary lines between the adjacent submounts 10 on the base material 21. The width of the cutting region RC is preferably, for example, approximately 100 to 300 µm.

The present manufacturing method includes a process of manufacturing the first and second metal electrode wires 22 and 23 on the surface of the base material 21, the lead terminals 24 and 25 on the rear surface of the base material 21, and the penetration electrode 27 (first manufacturing process) and a process of manufacturing the fluororesin film 26 (second manufacturing process) as the main manufacturing process of the wiring board body 20.

To form a rough surface having recesses and projections of, for example, approximately 6 µm at a maximum, if needed, a roughening process is performed on the surface of the base material 21 as a pre-process of the first manufacturing process. When the surface of the base material 21 has been already rough to some extent (for example, a rough surface having recesses and projections of, for example, approximately 6 µm at a maximum) or when other anchor effects are secured other than an anchor effect of the surface of the base material 21 to a sealing resin, the roughening process does not need to be performed.

Figure 5:
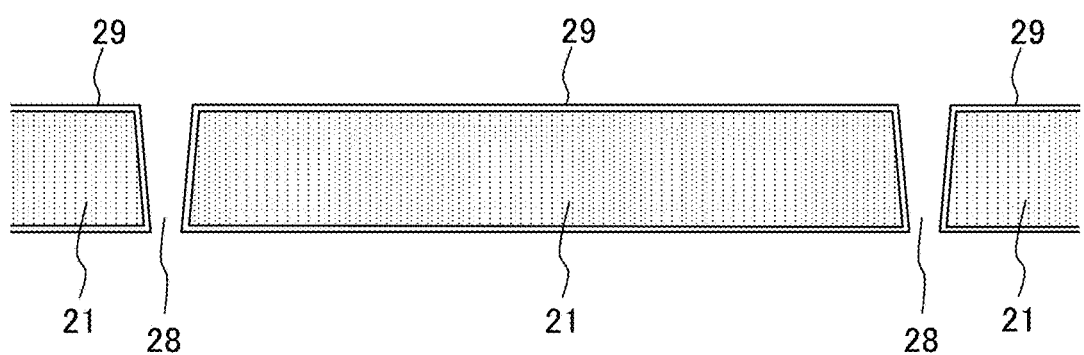
FIG. 5 is a process cross-sectional view schematically showing an embodiment of a process of forming first and second metal electrode wires, a lead terminal, and a penetration electrode in a manufacturing method of a submount according to the present invention.

In the first manufacturing process, at least one through-hole 28 is formed, for each of the first and second metal electrode wires 12 and 13, in a part of the base material 21 in which the penetration electrode 27 is formed by laser machining or the like. The number of the through-holes 28 for each of the first and second metal electrode wires 12 and 13 is equal to or larger than the required number that is determined depending on a forward current flowing in the light-emitting element 1 to be mounted. In an example shown in FIG. 5, an opening of the through-hole 28 on the surface of the base material 21 is larger than that on the rear surface of the base material 21. Preferably, the opening diameter (the diameter) of the through-hole 28 is, for example, approximately 50 to 75 µm on the surface side and approximately 25 to 50 µm on the rear surface side. The opening of the through-hole 28 on the rear surface of the base material 21 may be larger than that on the surface. The opening diameters are not limited to the preferable ranges mentioned above. As shown in FIG. 5, a Ni film or a Ti/Cu film that becomes a seed film 29 for feeding a power in electrolytic plating and has a film thickness of approximately 10 to 100 nm is then formed on the surface and rear surface of the base material 21 and an inner wall surface of the through-hole 28 by sputtering or the like. The seed film 29 is not limited to the Ni film or the Ti/Cu film as long as the seed film 29 is composed of a conductive material that has the adhesion to the base material 21 and the adhesion to thick plated films of the first and second metal electrode wires 22 and 23 and the lead terminals 24 and 25 (copper in the present embodiment).

A photosensitive sheet film 30 for plating is then adhered on the seed film 29 on the surface and rear surface of the base material 21. The openings of the through-hole 28 on the surface and rear surface of the base material 21 are masked by the photosensitive sheet film 30. Parts of the film 30 in which the first and second metal electrode wires 22 and 23 and the lead terminals 24 and 25 are formed are exposed to light and developed using a photolithography technique to be removed, so that the seed film 29 is exposed. The photosensitive sheet film 30 that has masked the openings of the through-hole 28 on the surface and rear surface of the base material 21 is also removed, and thus the seed film 29 on the inner wall surface of the through-hole 28 is also exposed.

Figure 6:
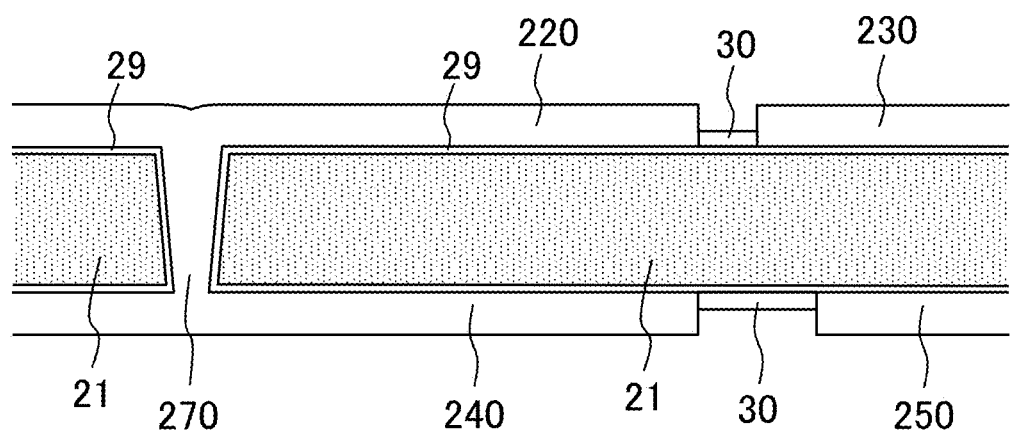
FIG. 6 is a process cross-sectional view schematically showing the embodiment of the process of forming first and second metal electrode wires, a lead terminal, and a penetration electrode in the manufacturing method of a submount according to the present invention.

As shown in FIG. 6, a power is then applied to the seed film 29 to form thick copper-plated films 220, 230, 240, 250, and 270 on the seed film 29 that is exposed on the surface and rear surface of the base material 21 and exposed in the through-hole 28 by an electrolytic plating method. The thick copper-plated films 220, 230, 240, 250, and 270 correspond to thick plated films of the first and second metal electrode wires 22 and 23, thick plated films of the lead terminals 24 and 25, and a thick plated film of the penetration electrode 27, respectively.

The sheet film 30 that is not covered by the thick plated films 220, 230, 240, 250, and 270 is then removed by an organic solvent or the like, and the seed film 29 that is not covered by the thick plated films 220, 230, 240, 250, and 270 is removed by wet etching or the like.

Immediately after the thick plated films 220, 230, 240, and 250 are formed, the film thicknesses on the surface and rear surface of the base material 21 are substantially the same. However, there are differences in the film thickness caused by the recesses and projections on the surface of the base material 21 and variations, depending on positions, in the intensity of an electric field applied to the seed film 29 in an electrolytic plating method. Consequently, when the film thicknesses of the thick plated films 220 and 230 that correspond to the first and second electrode pads 120 and 130, respectively, on the same submount 10 are different from each other to a certain extent or more, a well-known polishing process such as a CMP (chemical mechanical polishing) method or various mechanical polishing methods is performed on the surfaces of the thick plated films 220, 230, 240, and 250, if needed. When the polishing process is performed, it is only required that the film thicknesses of the thick plated films 220, 230, 240, and 250 after polishing are, for example, approximately 50 to 100 μm. The sheet film 30 and the seed film 29 may be removed after the polishing process.

The openings of the through-hole 28 on the surface and rear surface of the base material 21 immediately after the thick plated film 270 is formed are preferably closed by the thick plated film 270. However, when the openings have a diameter of approximately 6 to 15 μm, such openings do not cause any problems, because the openings are closed by a surface metal film to be described later.

In addition, in a case where the openings of the through-hole 28 on the surface and rear surface of the base material 21 are closed by the thick plated film 270 or in a case where the openings are closed after a surface metal film is formed, when the openings become cavities in the thick plated films 220, 230, 240, and 250 and the cavities might have adverse effects, the polishing process described above may be performed on the surfaces of the thick plated films 220, 230, 240, and 250 to remove the cavities.

After the thick plated films 220, 230, 240, 250, and 270 are formed or after the polishing process when the polishing process described above is performed, surface metal films 221, 231, 241, 251, and 271 each of which is constituted by three-layer metal films of, for example, Ni/Pd/Au in this order from the bottom are formed on the exposed surfaces of the upper surfaces and side wall surfaces of the thick plated films 220, 230, 240, 250, and 270 by a well-known electroless plating method, which is a wet plating method. The film thicknesses of the Ni/Pd/Au layers are, for example, 3 to 7.5 μm/50 to 150 nm/50 to 150 nm in this order from the bottom.

Figure 7:
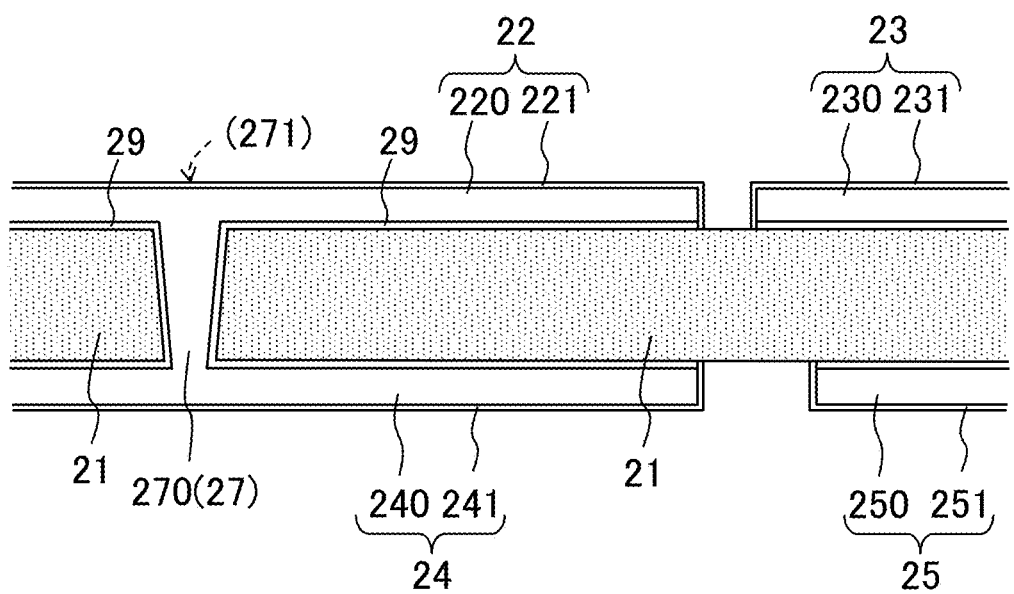
FIG. 7 is a process cross-sectional view schematically showing the embodiment of the process of forming first and second metal electrode wires, a lead terminal, and a penetration electrode in the manufacturing method of a submount according to the present invention.

With the first manufacturing process described above, as shown in FIG. 7, the first and second metal electrode wires 22 and 23, the lead terminals 24 and 25, and the penetration electrode 27 are formed on the wiring board body 20. FIG. 7 schematically shows a case where the polishing process described above is performed to planarize the upper surfaces of the first and second metal electrode wires 22 and 23 and the lead terminals 24 and 25.

Figure 8:
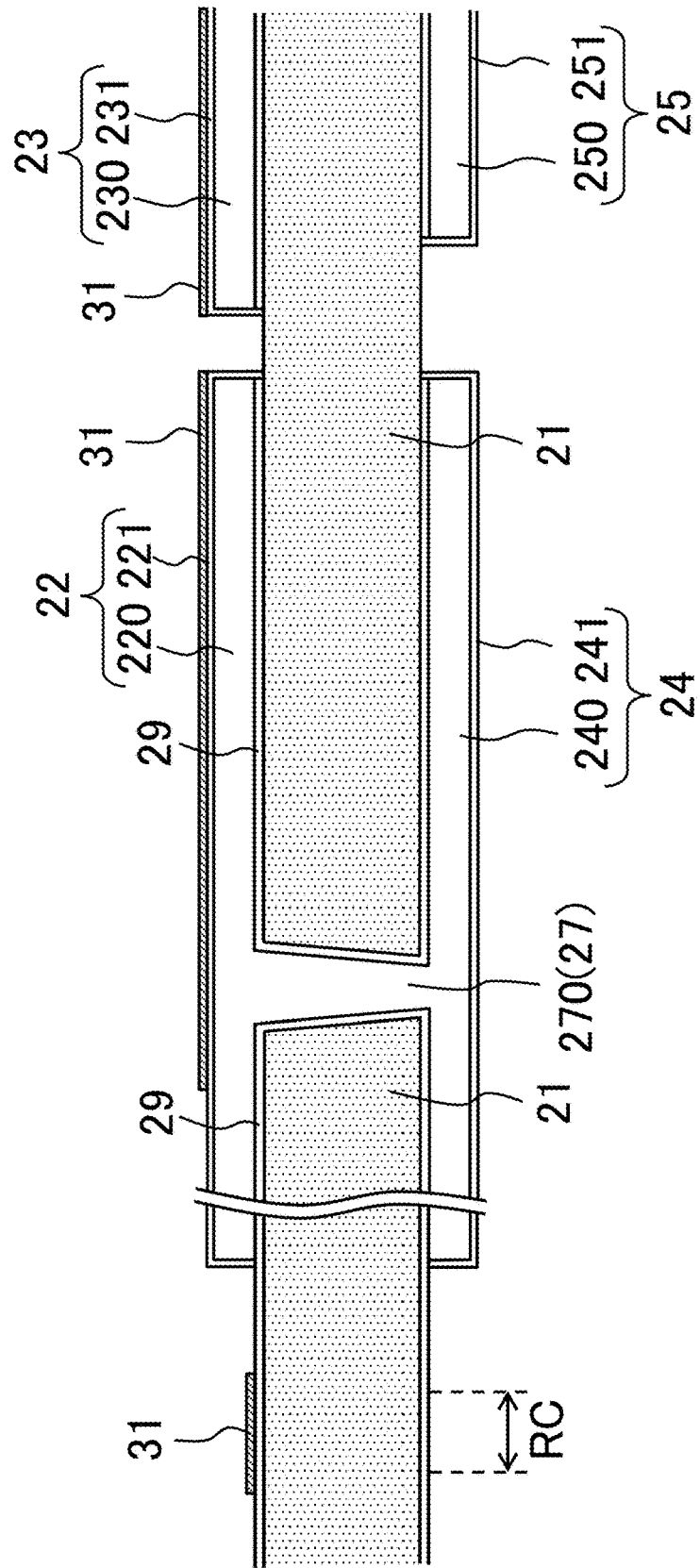
FIG. 8 is a process cross-sectional view schematically showing an embodiment of a process of forming a fluororesin film in the manufacturing method of a submount according to the present invention.

Next, the second manufacturing process is described. As shown in FIG. 8, a mask material 31 that blocks formation of the fluororesin film 26 is applied on a part of the surface of the base material 21 where the fluororesin film 26 is not formed (hereinafter, appropriately referred to as "mask part") by an ink-jet system, a dispensing system, or screen printing (step A1). In the present embodiment, the mask part includes at least the cutting region RC and the first and second electrode pads 120 and 130 of each submount 10 on the upper surfaces of the first and second metal electrode wires 22 and 23. The width of the mask part including the cutting region RC may be larger than that of the cutting region RC. The mask part including the first and second electrode pads 120 and 130 may be larger than the first and second electrode pads 120 and 130 if the mask part is within the upper surfaces of the first and second metal electrode wires 22 and 23. In addition, the mask part may include the surface of the base material 21 exposed on the bottom surface of the gap part between the first and second metal electrode wires 22 and 23 other than the first part, preferably other than the first and second parts or the first and third parts, more preferably other than the first, second, and third parts.

The mask material 31 is a resin composition obtained by kneading a binding resin that does not contain a fluororesin (an acryl resin, an epoxy resin, a cellulose resin, a phenol resin, a urethane resin, or the like), an organic solvent, and an additive selected as needed, and for example, an ink for screen printing or the like may be used. After applying the mask material 31, the mask material 31 is fixed on the mask part by heating or irradiation of ultraviolet light (step A2). In this case, the mask material 31 preferably has a viscosity (1 to 100 Pa·s) that when applied, the mask material 31 does not drip on the side wall surfaces of the first and second metal electrode wires 22 and 23 that are not the mask part. Even if the mask material 31 drips on the side wall surface when applied, any problem does not occur as long as the dripping mask material slightly covers an upper end part of the side wall surface. In addition, if the mask material 31 is colored by a pigment or a dye, it is convenient to visually or optically check whether the mask material 31 has been accurately transferred to the mask part.

Figure 9:
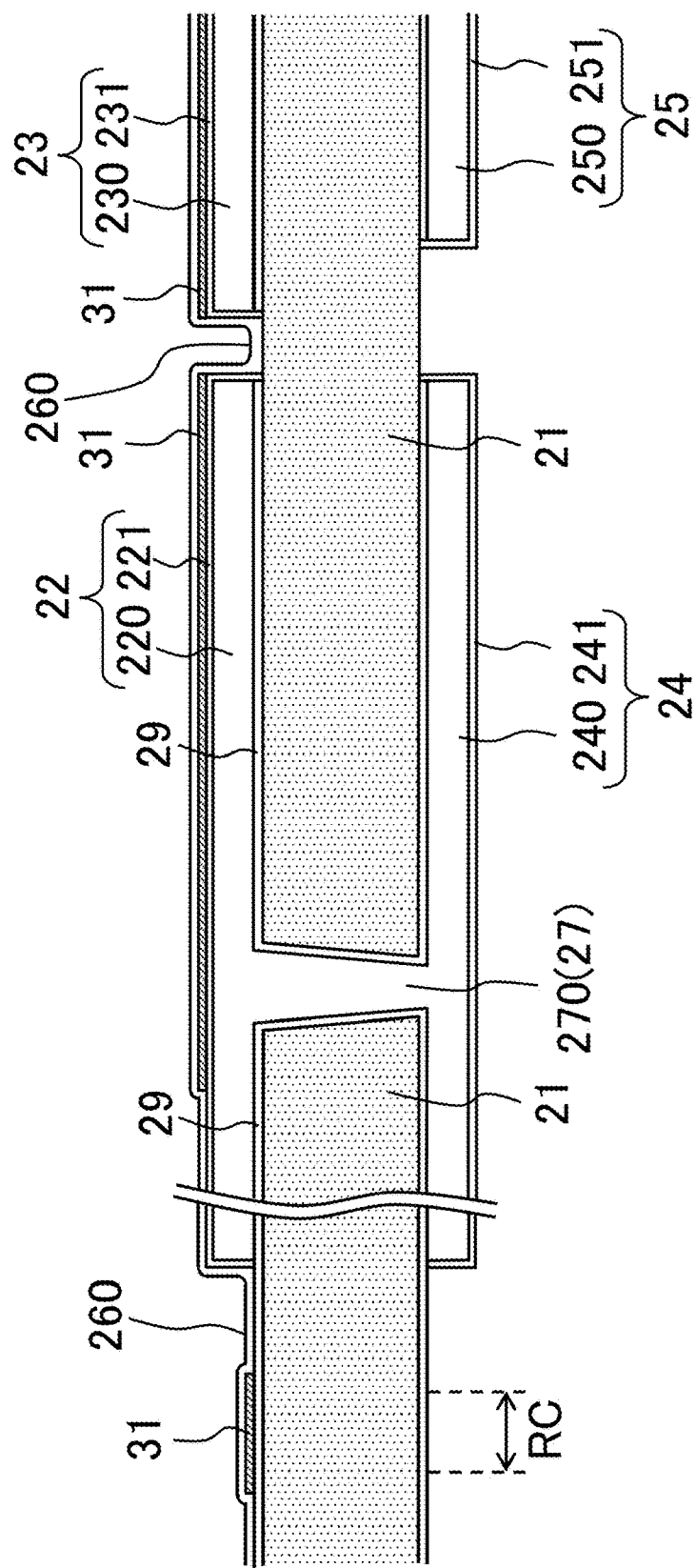
FIG. 9 is a process cross-sectional view schematically showing the embodiment of the process of forming a fluororesin film in the manufacturing method of a submount according to the present invention.

As shown in FIG. 9, a coating liquid 260 prepared by diluting a fluororesin that becomes the fluororesin film 26 with a solvent is then injected on the entire surface of the base material 21 having the mask material 31 formed thereon (step A3). The injected amount of the coating liquid 260 is such that the coating liquid 260 covers the upper surfaces of the first and second metal electrode wires 22 and 23 and the mask material 31 on the first and second metal electrode wires 22 and 23 is slightly covered by the coating liquid 260 or is not covered by the coating liquid 260. The coating liquid 260 is injected to cover the upper surfaces and the side wall surfaces of the first and second metal electrode wires 22 and 23 other than the mask part and the exposed surface of the base material 21 that is exposed on the bottom surface of the gap part between the first and second metal electrode wires 22 and 23. While the system of injecting the coating liquid 260 onto the surface of the base material 21 is not limited to a particular system, for example, an ink-jet system, a dispensing system, a potting system, a spin coating system, or the like may be employed.

Figure 10:
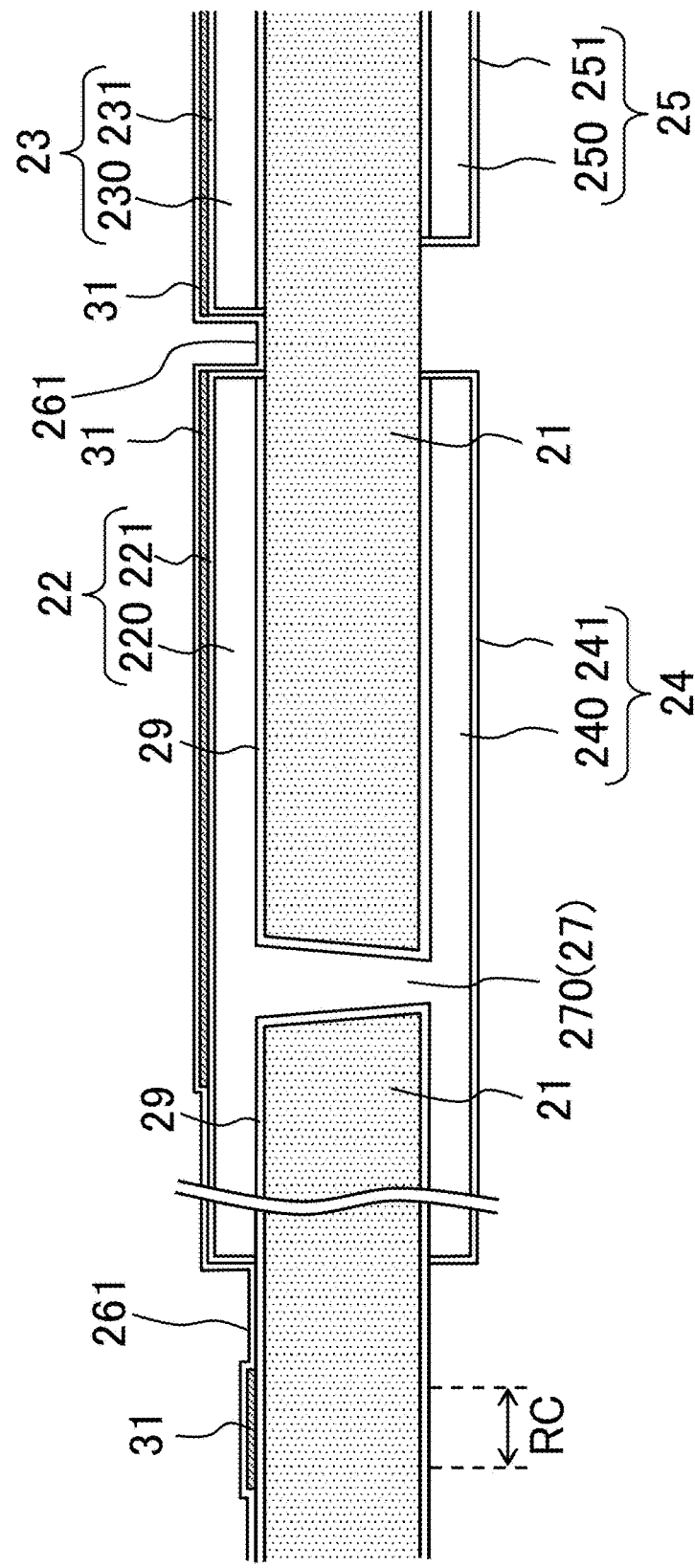
FIG. 10 is a process cross-sectional view schematically showing the embodiment of the process of forming a fluororesin film in the manufacturing method of a submount according to the present invention.

As shown in FIG. 10, the coating liquid 260 is then gradually heated to evaporate the solvent, and a base resin film 261, which is a raw film before being shaped into the fluororesin film 26, is formed on the surface of the base material 21 along recesses and projections on the surface of the base material 21 (step A4). At this time, the base resin film 261 is formed in a manner that the height of the upper surface of the coating liquid 260 is gradually reduced along the recesses and projections depending on the concentration of a fluororesin in the coating liquid 260, and the upper surfaces and side wall surfaces of the first and second metal electrode wires 22 and 23 other than the mask part and the exposed surface of the base material 21 that is exposed on the gap part between the first and second metal electrode wires 22 and 23 are covered. The base resin film 261 may also be formed on the upper and side surfaces of the mask material 31. It is only required that the base resin film 261 tightly covers the side wall surfaces of the first and second metal electrode wires 22 and 23 and the bottom surface of the gap part and it is not necessary to unnecessarily increase the film thickness. For example, the film thickness may be the thickness of a few atomic layers (approximately 10 nm). In addition, the film thickness is determined depending on the concentration of the fluororesin in the coating liquid 260 and a part on which the base resin film 261 is formed, and preferably is, for example, approximately 0.1 to 1 μm.

Figure 11:
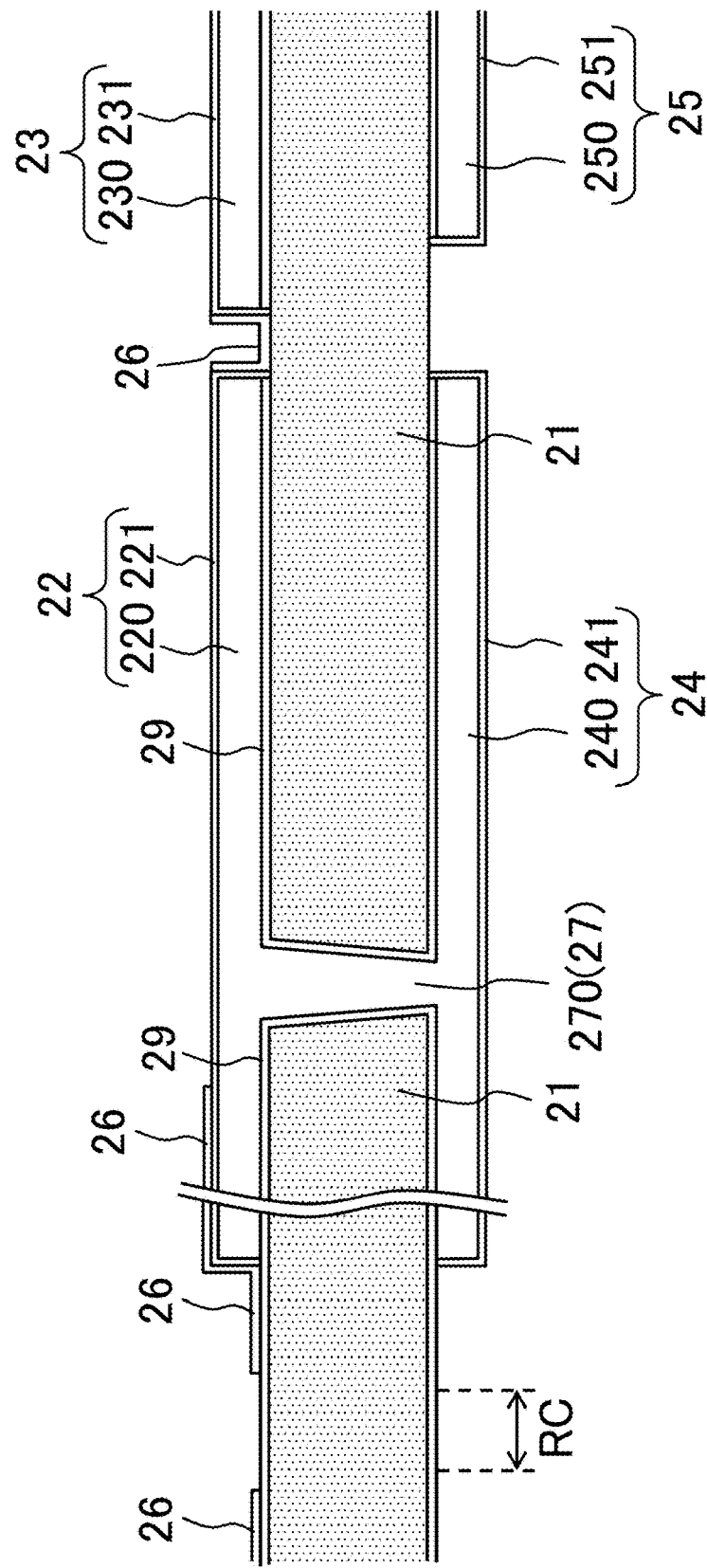
FIG. 11 is a process cross-sectional view schematically showing the embodiment of the process of forming a fluororesin film in the manufacturing method of a submount according to the present invention.

After the base resin film 261 is formed, the mask material 31 is then dissolved by an organic solvent that dissolves the mask material 31 (for example, acetone) (step A5). At this time, the organic solvent used is an organic solvent that does not dissolve the fluororesin composing the base resin film 261 but transmits through the fluororesin to dissolve the mask material 31. As the dissolved mask material 31 is washed and removed, the base resin film 261 that covers the upper surface of the mask material 31 is also removed. As a result, as shown in FIG. 11, it is possible to form the fluororesin film 26 that covers the upper surfaces and side wall surfaces of the first and second metal electrode wires 22 and 23 other than the mask part and the exposed surface of the base material 21 that is exposed on the gap part between the first and second metal electrode wires 22 and 23 (step A6). The fluororesin film 26 is formed on parts that have not been covered by the mask material 31.

The fluororesin film 26 is used as a solder resist material that prevents a solder material from being adhered to the first part, the second part, or the third part between the first and second metal electrode wires 22 and 23 in soldering for flip-chip mounting the light-emitting element 1. In addition, it is possible to prevent a short-circuit between the electrode wires caused by the migration of metal atoms in the solder material.

Next, the coating liquid 260 used for forming the fluororesin film 26 is briefly described. In a light-emitting device obtained by flip-chip mounting the light-emitting element 1, ultraviolet light emitted from an active layer passes through the template 2 to be emitted from a rear surface of a sapphire substrate and passes through a sealing resin to be radiated outside. The part in which the fluororesin film 26 is formed is on the upper surface side of the light-emitting element 1, which is opposite to the rear surface of the sapphire substrate from which the ultraviolet light is emitted, and thus the fluororesin film 26 is not necessarily same as a fluororesin that is transparent to the ultraviolet light used for the sealing resin.

However, in a resin sealing process during flip-chip mounting, the sealing resin is also filled in a void remaining in the gap part between the first and second metal electrode wires 22 and 23 after the fluororesin film 26 is formed. Consequently, an amorphous fluororesin that is appropriately used as the sealing resin is used as the fluororesin used for the coating liquid 260 in the present embodiment.

There are roughly two types of the amorphous fluororesin: a non-bonding fluororesin (first type amorphous fluororesin) having non-reactive functional groups including a terminal functional group that is not bondable to metal and a bonding fluororesin (second type amorphous fluororesin) having reactive functional groups including a terminal functional group bondable to metal. In an aspect of the present embodiment, the first type amorphous fluororesin that is highly effective to prevent migration of metal atoms is used.

More specifically, in the first type amorphous fluororesin, the structural unit that constitutes a polymer or a copolymer has a fluorine-containing aliphatic cyclic structure and the terminal functional group is a perfluoroalkyl group such as $CF_3$. That is, the first type amorphous fluororesin does not have the reactive terminal functional group bondable to metal. On the other hand, the reactive functional group of the second type amorphous fluororesin is, for example, a carboxyl group (COOH) or an ester group (COOR). R denotes an alkyl group.

The unit based on a cyclic fluorine-containing monomer (hereinafter, "unit A") or the unit formed by cyclopolymerization of diene fluorine-containing monomers (hereinafter, "unit B") is preferable as the structural unit with the fluorine-containing aliphatic cyclic structure. The composition and structure of the amorphous fluororesin are not the subject of the invention of the present application, and thus detailed descriptions of the unit A and the unit B are omitted. For reference, the unit A and the unit B are described in detail in paragraphs [0031] to [0062] of Patent Document 1 by the same applicant as the present application.

The coating liquid 260 is produced by dissolving the first type amorphous fluororesin in a fluorine-containing solvent, preferably an aprotic fluorine-containing solvent. For reference, the fluorine-containing solvent is described in detail in paragraphs [0067] to [0073] of Patent Document 1. The concentration of the first type amorphous fluororesin in the coating liquid 260 is adjusted in a manner that the fluororesin film 26 has the film thickness described above (approximately 0.1 to 1 μm).

An example of commercially available products of the first type amorphous fluororesin is CYTOP (manufactured by Asahi Glass Co., Ltd.). CYTOP having a $CF_3$ terminal functional group is a copolymer of the unit B shown in the following Chemical 1.

[Chemical 1]

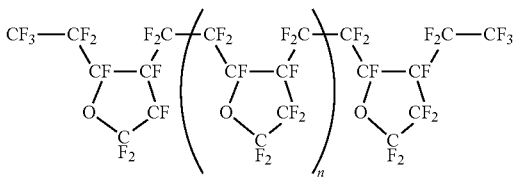

Through the steps described above, the wiring board body 20 that includes the first and second metal electrode wires 22 and 23, the lead terminals 24 and 25, the penetration electrode 27 and the fluororesin film 26 is completed.

When the wiring board body 20 is completed, a plurality of the submounts 10 are arranged in a matrix to be integrated as a plate. A predetermined inspection step is then performed and the base material 21 is cut along the cutting regions RC, or trenches for dividing are formed in the cutting regions RC and then the base material 21 is divided by a well-known cutting or machining technique such as laser machining, so that each of the submounts 10 is obtained.

Before cutting or dividing the base material 21, the light-emitting element 1 may be flip-chip mounted on each of the submounts 10 of the wiring board body 20 and sealed with a sealing resin. Thereafter, a predetermined inspection step may be performed as needed.

Figure 12:
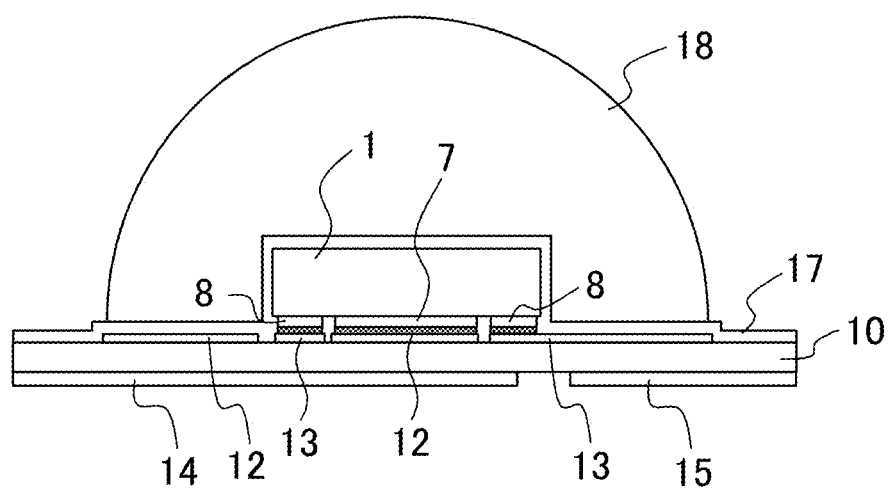
FIG. 12 is a cross-sectional view schematically showing a state where a nitride semiconductor ultraviolet light-emitting element is flip-chip mounted on the submount according to the present invention and sealed with resin.

In the light-emitting element 1, the upper surfaces of the first and second plated electrodes 7 and 8 face downward, the first plated electrode 7 opposes the first electrode pad 120, the four second plated electrodes 8 oppose the four second electrode pads 130, and in such a state, these electrodes are electrically and physically connected to each other by soldering. In this way, the light-emitting element 1 is mounted on the center part of the base material 11 and fixed thereon. FIG. 12 shows a state where the light-emitting element 1 is flip-chip mounted on the submount 10 and sealed with a sealing resin 17. In FIG. 12, as an example, an upper surface of the sealing resin 17 is covered by a collecting lens 18 composed of a fluororesin that is the same as the sealing resin 17. The fluororesin lens 18 may be formed by, for example, injection molding, transfer molding, compression molding, or the like. A metal mold, a silicone resin mold, or combinations thereof may be used for a mold for molding. The lens 18 does not need to be composed of a fluororesin and may be composed of other materials with ultraviolet transmission characteristics adaptable to the light emission wavelength of the light-emitting element 1. Although the lens 18 is preferably composed of a material with a small refractive index difference between the material and the sealing resin 17, a quartz glass lens may be used. The lens 18 may be, in addition to a collecting lens, a lens that diffuses light depending on intended use, and the lens 18 does not need to be necessarily provided.

Second Embodiment

Next, another embodiment of the submount 10 and the wiring board body 20 is described as a modification of the first embodiment. A submount 10 and a wiring board body 20 according to a second embodiment have the same element structure as in the first embodiment, but are different from those of the first embodiment in detailed parts of the second manufacturing process (the manufacturing process of the fluororesin film 26) in the manufacturing method of the wiring board body 20. The different parts in the second manufacturing process are described below.

In the second manufacturing process of the first embodiment, the mask material 31 that blocks formation of the fluororesin film 26 and does not contain a fluororesin is applied on a predetermined mask part on the surface of the base material 21 at steps A1 and A2. In the second embodiment, steps A1 and A2 are not performed. That is, the mask material 31 that blocks formation of the fluororesin film 26 is not formed on the predetermined mask part. In addition, step A3 is not performed, that is, the coating liquid 260 is not injected on the entire surface of the base material 21. The coating liquid 260 is locally injected in a part in which the fluororesin film 26 needs to be formed, for example, the first part, preferably the first and second parts or the first and third parts, and more preferably the first, second, and third parts between the first and second metal electrode wires 22 and 23 by, for example, an ink-jet system (step B3). The injected amount of the coating liquid 260 is such that the coating liquid 260 does not cover the upper surfaces of the first and second metal electrode wires 22 and 23 but covers at least a lower end side of the side wall surfaces of the first and second metal electrode wires 22 and 23 in an injected part such as the first part is covered. The entire side wall surface to an upper end thereof does not need to be covered.

After the coating liquid 260 is locally injected at step B3, step A4 is performed in the same manner as in the first embodiment. In the second embodiment, steps A5 and A6 are not necessary. It is thus possible to form the fluororesin film 26 that covers the bottom surface of the gap part between the first and second metal electrode wires 22 and 23 and the lower end parts of the side wall surfaces of the first and second metal electrode wires 22 and 23 opposing to each other with the bottom surface interposed therebetween in the injected part of the coating liquid 260 such as the first part, the first and second parts, the first and third parts, or the first, second, and third parts between the first and second metal electrode wires 22 and 23.

In the second embodiment, if the injected amount of the coating liquid 260 is locally increased, the coating liquid 260 may cover the upper surfaces of the first and second metal electrode wires 22 and 23 near the locally increased part of the injected amount. If the coating liquid 260 covers the upper surfaces of the first and second metal electrode wires 22 and 23, after step A6, the fluororesin film 26 that covers the upper surfaces of the first and second metal electrode wires 22 and 23 is removed by a well-known polishing method such as a CMP (chemical mechanical polishing) method or various mechanical polishing methods until the outermost surfaces of the surface metal films 221 and 231 of the first and second metal electrode wires 22 and 23 are exposed and a metal of the outermost layers (Au) remains on the upper surfaces of the first and second metal electrode wires 22 and 23 (step A7).

In the second embodiment, when the polishing process is performed at step A7, the metal of the outermost layers of the surface metal films 221 and 231 is polished to some extent to become thin. Consequently, when the surface metal films 221 and 231 are formed by electroless plating, the film thickness of the outermost layers is preferably larger than the film thicknesses in the first embodiment. Instead of setting the film thickness of the outermost layers of the surface metal films 221 and 231 to be larger than those of the first embodiment, or in addition thereto, after polishing at step A7, the metal of the outermost layers (Au) may be formed again on the exposed surfaces of the surface metal films 221 and 231 by electroless plating.

Third Embodiment

Next, another embodiment of the submount 10 and the wiring board body 20 is described with reference to FIG. 13 as a modification of the first embodiment. In the submount 10 and the wiring board body 20 of the first embodiment, the mask material 31 is formed in the mask part including the cutting region RC so that the fluororesin film 26 is not formed in at least the cutting region RC. Consequently, when the base material 21 of the wiring board body 20 is cut or divided along the cutting regions RC, it is possible to prevent in advance an outer circumferential end of the fluororesin film 26 from being damaged and peeled at an outer circumferential end part of each divided submount 10.

According to a third embodiment, in the second manufacturing process of the first embodiment, a second fluororesin film 32 that is composed of the second type amorphous fluororesin with higher bondability to metal than the fluororesin film 26 that uses the first type amorphous fluororesin, or that mainly contains the second type amorphous fluororesin is formed first, as a primer film of the fluororesin film 26, on the cutting region RC and the side region thereof by, for example, an ink-jet system (step C1). The mask material 31 is not formed in at least the cutting region RC, that is, the mask part that does not include the cutting region RC is set. Steps A1 and A2 in the second manufacturing process are then performed. Steps A3 to A6 described in the first embodiment are then performed. It is not necessary to set the film thickness of the second fluororesin film 32 to be unnecessarily thick. The film thickness of the second fluororesin film 32 may be less than the film thickness of the fluororesin film 26, for example, may be equal to the thickness of a single-layer molecular layer, which is preferably approximately 0.01 to 0.5 μm.

Figure 13:
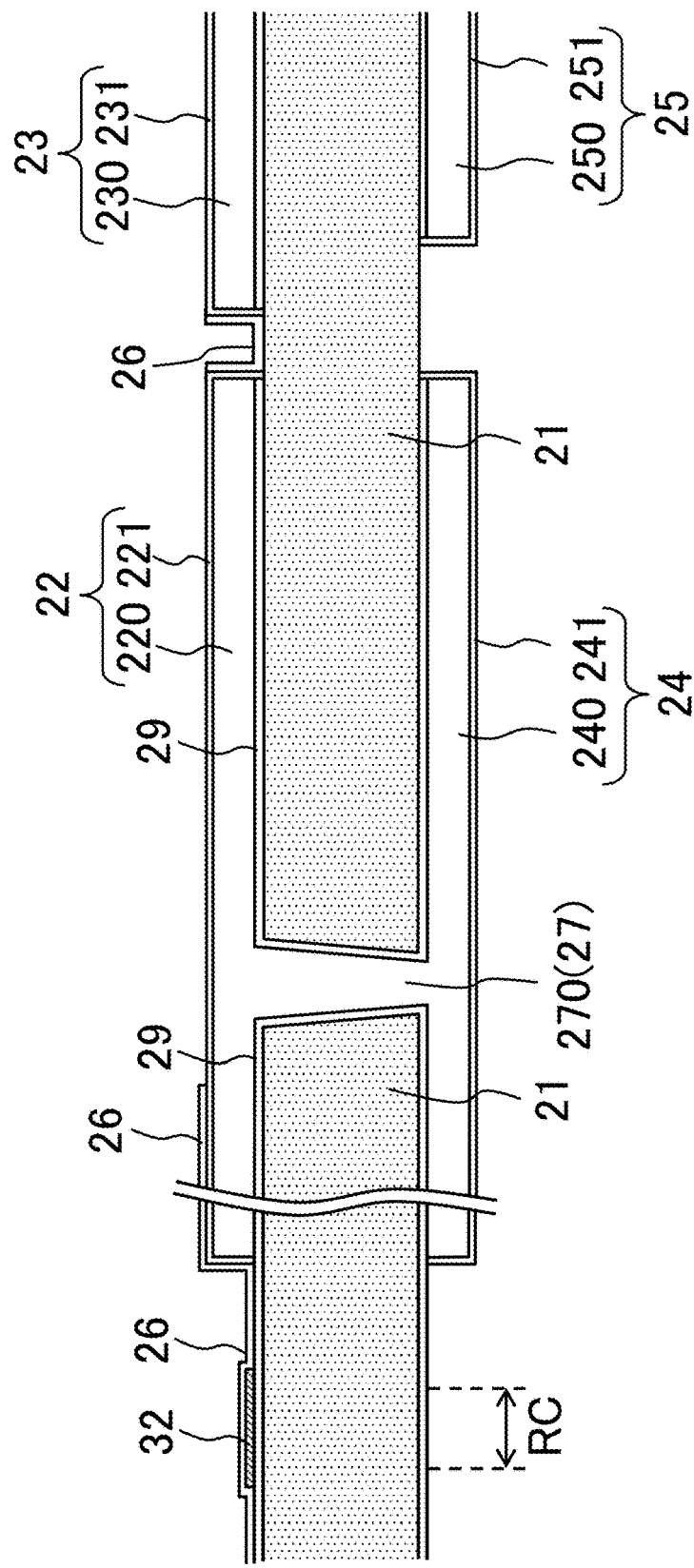
FIG. 13 is a cross-sectional view schematically showing a cross-sectional structure of a main part of the submount according to the third embodiment of the present invention.

As a result, in the third embodiment, the fluororesin film 26 is also formed on the cutting region RC and the side region thereof through the second fluororesin film 32, as shown in FIG. 13. When the wiring board body 20 is cut or divided along the cutting regions RC, even if an outer circumferential end of the fluororesin film 26 is damaged at an outer circumferential end part of each divided submount 10, the second fluororesin film 32 functions as a binder and can prevent the circumferential end of the fluororesin film 26 from been peeled at the outer circumferential end of the wiring board body 20. As long as the second fluororesin film 32 is formed on the side region of the cutting region RC, the peeling above described is prevented.

The third embodiment assumes a case where the mask part does not include the cutting region RC, that is, the fluororesin film 26 is formed on the cutting region RC when steps A1 and A2 of the second manufacturing process are performed. However, as in the first embodiment, steps A1 and A2 of the second manufacturing process may be performed on the mask part including the cutting region RC so as not to form the fluororesin film 26 on the cutting region RC.

In addition, while the third embodiment is described as a modification of the first or second embodiment, when the coating liquid 260 is injected also in the cutting region RC by local injection of the coating liquid 260 at step B3 in the second embodiment, step C1 may be performed before step B3.

Fourth Embodiment

Next, yet another embodiment of the submount 10 and the wiring board body 20 is described with reference to FIGS. 14 and 15 as a modification of the first to third embodiments.

In the first to third embodiments, the submount 10 is for flip-chip mounting a light-emitting element 1 thereon. A fourth embodiment describes a submount for flip-chip mounting a plurality of the light-emitting elements 1 in serial, parallel, or serial-parallel. In the submount of the fourth embodiment, a plurality of the light-emitting elements 1 are mounted thereon, thus configuring an electrical circuit including the light-emitting elements 1. The submount of the fourth embodiment is thus one embodiment of the wiring board described above.

In the following description, a submount 40 including three light-emitting elements 1 connected in serial and a wiring board body 50 obtained by arranging the submounts 40 in a matrix to be integrated as a plate are described as an example. For the convenience of explanation, the three light-emitting elements 1 are referred to as light-emitting elements 1a, 1b, and 1c in the order of connection, a cathode of the light-emitting element 1a is connected to an anode of the light-emitting element 1b, and a cathode of the light-emitting element 1b is connected to an anode of the light-emitting element 1c. As a result, an anode of the light-emitting element 1a is an anode terminal and a cathode of the light-emitting element 1c is a cathode terminal in a serial circuit of the light-emitting elements 1a, 1b, and 1c.

FIG. 14A is a plan view showing a planar view shape of the submount 40. FIG. 14B is a cross-sectional view showing a cross-sectional shape of a cross-section that passes the center of the submount 40 in the plan view of FIG. 14A, is parallel to a serial direction of the light-emitting elements 1, and is vertical to the surface of the submount 40. In an example shown in FIGS. 14A and 14B, as an example, a short side of the submount 40 is equal to a side of the submount 10 in length, and a long side of the submount 40 is approximately three times longer than a side of the submount 10.

The submount 40 includes a plate-like base material 41 (corresponding to "the insulating base material") composed of the same insulating material as the base material 11 of the first embodiment. First to fourth metal electrode wires 42 to 45 are formed on a surface of the base material 41 and lead terminals 46 and 47 are formed on a rear surface of the base material 41. The base material 41 is completely the same as the base material 11 of the first embodiment except for the size of a planar view shape, and thus overlapping descriptions thereof are omitted.

The first and fourth metal electrode wires 42 and 45 on the surface side of the base material 41 are respectively connected to the lead terminals 46 and 47 on the rear surface side of the base material 41 via penetration electrodes (not shown) formed in the base material 41. When the submount 40 is mounted on other wiring boards or the like, metal wires on the wiring boards are electrically connected to the lead terminals 46 and 47. In addition, the lead terminals 46 and 47 cover substantially the entire rear surface of the base material 41 to function as a heat sink. The first to fourth metal electrode wires 42 to 45 correspond to metal films.

In the fourth embodiment, the planar view shapes of the first to fourth metal electrode wires 42 and 45 are formed in a manner that the first metal electrode wire 42 is connected to the first plated electrode 7, which is the anode of the light-emitting element 1a, the second metal electrode wire 43 is connected to the second plated electrode 8, which is the cathode of the light-emitting element 1a, and to the first plated electrode 7, which is the anode of the light-emitting element 1b, the third metal electrode wire 44 is connected to the second plated electrode 8, which is the cathode of the light-emitting element 1b, and to the first plated electrode 7, which is the anode of the light-emitting element 1c, and the fourth metal electrode wire 45 is connected to the second plated electrode 8, which is the cathode of the light-emitting element 1c.

Specifically, as can be seen from comparison of FIG. 14A with FIG. 3A, the first metal electrode wire 42 has a planar view shape that is identical to that of the first metal electrode wire 12 shown in FIG. 3A. The second metal electrode wire 43 and the third metal electrode wire 44 have a planar view shape obtained by connecting the first metal electrode wire 12 and the second metal electrode wire 13 shown in FIG. 3A in the serial direction. The fourth metal electrode wire 45 has a planar view shape that is identical to that of the second metal electrode wire 13 shown in FIG. 3A.

In addition, in the first to fourth metal electrode wires 42 to 45, as shown in FIG. 14A, the first metal electrode wire 42 is constituted by a first electrode pad 420 and a first wire part 421 connected to the first electrode pad 420, the second metal electrode wire 43 is constituted by five second electrode pads 430 and a second wire part 431 connected to the second electrode pads 430, the third metal electrode wire 44 is constituted by five third electrode pads 440 and a third wire part 441 connected to the third electrode pads 440, and the fourth metal electrode wire 45 is constituted by four fourth electrode pads 450 and a fourth wire part 451 connected to the fourth electrode pads 450.

Although not shown in FIGS. 14A and 14B, similarly to the first and second metal electrode wires 12 and 13, the first to fourth metal electrode wires 42 to 45 are constituted by a thick copper-plated film and a single-layer or multi-layer surface metal film that covers a surface (an upper surface and a side wall surface) of the thick plated film. The configuration of the thick copper-plated film and the surface metal film and the method of producing these films are the same as those of the first and second metal electrode wires 12 and 13 of the first embodiment, and thus overlapping descriptions thereof are omitted.

In the fourth embodiment, the lead terminals 46 and 47 on the rear surface side of the base material 41 are also constituted by a thick copper-plated film and a single-layer or multi-layer surface metal film that covers a surface (an upper surface and a side wall surface) of the thick plated film, similarly to the first to fourth metal electrode wires 42 to 45 on the surface side of the base material 41. The configuration of the thick plated films and the surface metal films of the lead terminals 46 and 47 and the method of producing these films are the same as those of the lead terminals 14 and 15 of the first embodiment, and thus overlapping descriptions thereof are omitted.

Figure 15:
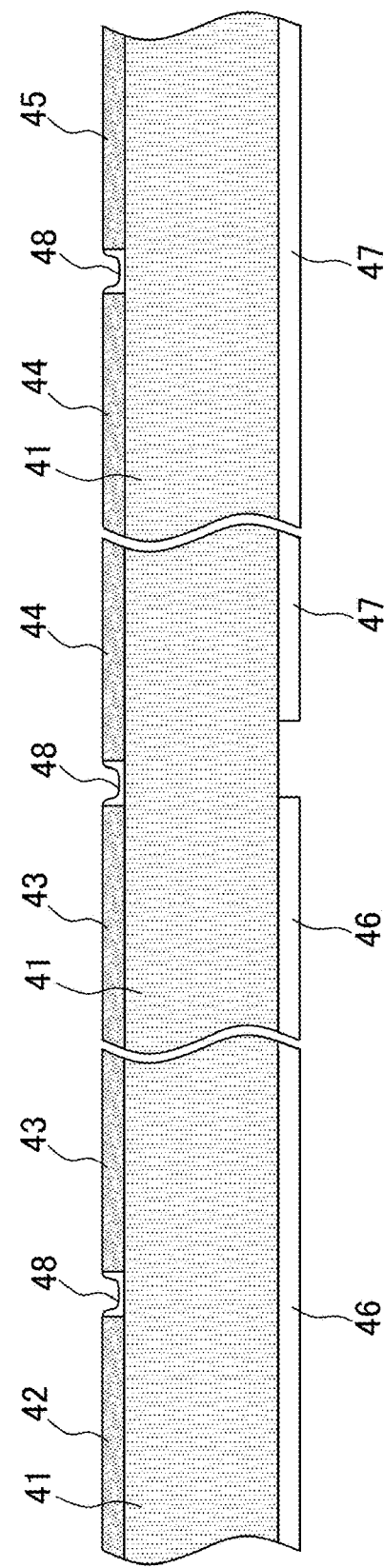
FIG. 15 is a cross-sectional view schematically showing a cross-sectional structure of a main part after a fluororesin film is formed in the submount according to the fourth embodiment of the present invention.

In the fourth embodiment, as schematically shown in FIG. 15, a fluororesin film 48 is formed to cover side wall surfaces of the first to fourth metal electrode wires 42 to 45, and the surfaces of the base material 41 exposed on bottom surfaces of gap parts between the first and second metal electrode wires 42 and 43, between the second and third metal electrode wires 43 and 44, and between third and fourth metal electrode wires 44 and 45.

The fluororesin film 48 does not need to cover all of the side wall surfaces of the first to fourth metal electrode wires 42 to 45 and the surfaces of the base material 41 exposed on the bottom surfaces of the gap parts between the first and second metal electrode wires 42 and 43, between the second and third metal electrode wires 43 and 44, and between third and fourth metal electrode wires 44 and 45. The fluororesin film 48 preferably covers at least the first part, preferably the first and second parts or the first and third parts, more preferably the first, second, and third parts, which are described in the first embodiment, and the side wall surfaces of the first to fourth metal electrode wires 42 to 45 opposing to each other with these parts interposed therebetween.

In the fourth embodiment, the first, second, and third parts are present between the first and second metal electrode wires 42 and 43, between the second and third metal electrode wires 43 and 44, and between the third and fourth metal electrode wires 44 and 45, respectively, as with between the first and second metal electrode wires 12 and 13 in the first embodiment. A material of the fluororesin film 48 and a method of forming the fluororesin film 48 are the same as those of the fluororesin film 16 of the first to third embodiments, and thus overlapping descriptions thereof are omitted.

In addition, a manufacturing method of the submount 40 is the same as the manufacturing method of the submount 10 described in the first to third embodiments, and thus overlapping descriptions thereof are omitted.

Fifth Embodiment

As an embodiment of the present base, with reference to FIGS. 16A and 16B, described is a wiring board that has, instead of the light-emitting element 1 of the first embodiment, one or more submounts 10 of the first embodiment on each of which the light-emitting element 1 is mounted or the submount 40 of the fourth embodiment mounted thereon. In the following description, a wiring board 50 on which the submounts 10 described in the first embodiment are mounted to configure a serial circuit of three submounts 10 is described. For the convenience of explanation, the three submounts 10 are referred to as submounts 10a, 10b, and 10c in the order of connection.

FIG. 16A is a plan view showing a planar view shape of the wiring board 50. FIG. 16B is a cross-sectional view showing a cross-sectional shape of a cross-section that passes the center of the wiring board 50 in the plan view of FIG. 16A, is parallel to a serial direction of the submounts 10, and is vertical to the surface of the wiring board 50. In an example shown in FIGS. 16A and 16B, as an example, a short side of the wiring board 50 is longer than a side of the submount 10, and a long side of the wiring board 50 is approximately three times longer than a side of the submount 10.

The wiring board 50 includes a plate-like base material 51 (corresponding to "the insulating base material") composed of the same insulating material as the base material 11 of the first embodiment. First to fourth metal electrode wires 52 to 55 are formed on a surface of the base material 51. Unlike the submounts 10 and 40 of the first and fourth embodiments, lead terminals are not formed on a rear surface side of the base material 51 and thus penetration electrodes are not included in the base material 51. The base material 51 is completely the same as the base material 11 of the first embodiment except for the size of a planar view shape, and thus overlapping descriptions thereof are omitted.

In a fifth embodiment, the planar view shapes of the first to fourth metal electrode wires 52 and 55 are formed in a manner that the first metal electrode wire 52 is connected to a lead terminal 14, which is an anode of the submount 10a, the second metal electrode wire 53 is connected to a lead terminal 15, which is a cathode of the submount 10a and to the lead terminal 14, which is an anode of the submount 10b, the third metal electrode wire 54 is connected to the lead terminal 15, which is a cathode of the submount 10b, and to the lead terminal 14, which is an anode of the submount 10c, and the fourth metal electrode wire 55 is connected to the lead terminal 15, which is a cathode of the submount 10c. The planar view shapes of the lead terminals 14 and 15 of the submount 10 are a rectangular shape, and thus the planar view shapes of the first to fourth metal electrode wires 52 to 55 are also a rectangular shape.

Although not shown in FIGS. 16A and 16B, similarly to the first and second metal electrode wires 12 and 13 of the first embodiment, the first to fourth metal electrode wires 52 to 55 are constituted by a thick copper-plated film and a single-layer or multi-layer surface metal film that covers a surface (an upper surface and a side wall surface) of the thick plated film. The configuration of the thick copper-plated film and the surface metal film, and the method of producing these films are the same as those of the first and second metal electrode wires 12 and 13 of the first embodiment, and thus overlapping descriptions thereof are omitted.

In the fifth embodiment, a fluororesin film 56 is formed to cover the surfaces of the base material 51 exposed on bottom surfaces of gap parts between the first and second metal electrode wires 52 and 53, between the second and third metal electrode wires 53 and 54, and between third and fourth metal electrode wires 54 and 55, and side wall surfaces of the first to fourth metal electrode wires 52 to 55 opposing to each other with the surfaces interposed therebetween. The fluororesin film 56 may cover parts of upper surfaces of the first to fourth metal electrode wires 52 to 55 that are not used for connection to the lead terminals 14 and 15 of the submount 10, and the exposed surface of the base material 51 other than the parts described above. A material of the fluororesin film 56 and a method of forming the fluororesin film 56 are the same as those of the fluororesin film 16 of the first to third embodiments, and thus overlapping descriptions thereof are omitted.

In addition, a manufacturing method of the wiring board 50 is the same as the manufacturing method of the submount 10 described in the first to third embodiments except that a lead terminal and a penetration electrode are not necessary, and thus overlapping descriptions thereof are omitted.

Other Embodiments

Modifications of the first to fifth embodiments are described below.

(1) The first to fifth embodiments describe a case where the fluororesin films 16, 48, and 56 are composed of an amorphous fluororesin that is the same as that used for resin seal when flip-chip mounting the light-emitting element 1. However, ultraviolet light is emitted from the light-emitting element 1 to the side opposite to the base such as the submounts 10 and 40 and the wiring board 50, and the part in which the fluororesin film 16, 48, or 56 is formed is not disposed on a light-emitting path. Consequently, the fluororesin films 16, 48, and 56 do not need to be composed of an amorphous fluororesin that transmit ultraviolet light. That is, the fluororesin films 16, 48, and 56 may be composed of a fluororesin that contains a crystalline part with ultraviolet resistance identical to the amorphous fluororesin.

(2) The first to fifth embodiments have described a case where a non-bonding fluororesin (first type amorphous fluororesin) that has non-reactive functional groups including a terminal functional group that is not bondable to metal is used as the fluororesin films 16, 48 and 56. However, a bonding fluororesin (second type amorphous fluororesin) that has reactive functional groups including a terminal functional group bondable to metal may be partially used as the fluororesin film 26.

In this case, the second type amorphous fluororesin has higher bondability to a metal surface than the first type amorphous fluororesin. Consequently, it is preferable to configure in a manner that the fluororesin films 16, 48 and 56 have a two-layer structure of the second type amorphous fluororesin and the first type amorphous fluororesin, an extremely thin second type amorphous fluororesin film is formed as a first layer that directly contacts the side wall surfaces of the first and second metal electrode wires 12 and 13 and the first to fourth metal electrode wires 42 to 45 and 52 to 55, and a first type amorphous fluororesin film is then formed on the first layer. In this case, it is only required that the total film thickness of the first layer and the second layer is equal to the film thickness of each of the fluororesin films 16, 48 and 56 exemplified in the first to fifth embodiments, and that the film thickness of the first layer is equal to or larger than the thickness of a few atomic layers. The first and second amorphous fluororesin film layers are formed as follows. That is, steps A3 and A4 in the second manufacturing process described in the first embodiment are repeated twice, that is, for the second type amorphous fluororesin film and the first type amorphous fluororesin film, and then step A5 is performed. At step A3, which is performed for the second time, the base resin film 261 of the first layer formed at step A4, which is performed for the first time, might be partially dissolved to become thin. Consequently, it is preferable to form the base resin film 261 of the first layer to be thick so as not to be completely dissolved.

(3) While FIG. 3A exemplifies the planar view shape of the first and second metal electrode wires 12 and 13, FIG. 14A exemplifies the planar view shape of the first to fourth metal electrode wires 42 to 45, and FIG. 16A exemplifies the planar view shape of the first to fourth metal electrode wires 52 to 55 in the first to fifth embodiments, these planar view shapes are not limited to the shapes exemplified in the drawings. These planar view shapes may be appropriately changed depending on the arrangement and shape of the light-emitting element 1 and terminals of other components mounted thereon. The light-emitting element mounted on the submounts 10 and 40 of the first and fourth embodiments is not limited to the light-emitting element that has the structure described in the first embodiment with reference to FIGS. 1 and 2. In addition, the top view shape of the first and second plated electrodes 7 and 8 of the light-emitting element 1 is not limited to the shape exemplified in FIG. 2.

In the submounts 10 and 40 described in the first to fourth embodiments, when a resin dam that is formed around a part in which a sealing resin is formed to prevent the sealing resin from overflowing over the part in which the sealing resin is formed is formed around a position where the light-emitting element 1 is mounted, it is preferable to set the planar view shapes so that the first and second metal electrode wires 12 and 13 or the first to fourth metal electrode wires 42 to 45 are accommodated within the resin dam.

It is only required that the resin dam described above is composed of a material that is not degraded by ultraviolet light. For example, the same insulating material as the base materials 11 and 41 or other insulating materials suitable for use may be used to produce the base materials 11 and 41 in a manner that a surrounding part of the submount 10, 40 that annularly surrounds the center part on which the light-emitting element 1 is mounted is thicker than the center part, and the surrounding part may function as the resin dam. In addition, when materials other than the insulating materials described above are used for the resin dam, it is preferable to use a material that has liquid repellency to a coating liquid used for forming a sealing resin.

(4) According to the first to third embodiments, in the first manufacturing process, the through-hole 28 is formed first in the base material 21 and then the thick plated films 220 and 230 of the first and second metal electrode wires 22 and 23, the thick plated films 240 and 250 of the lead terminals 24 and 25, and the thick plated film 270 of the penetration electrode 27 are formed simultaneously. In addition, the surface metal films 221 and 231 of the first and second metal electrode wires 22 and 23, the surface metal films 241 and 251 of the lead terminals 24 and 25, and the surface metal film 271 of the penetration electrode 27 are formed simultaneously. However, before the first and second metal electrode wires 22 and 23 and the lead terminals 24 and 25 are formed in the manner described in the first embodiment, the penetration electrode 27 may be formed by filling a conductive material in the through-hole 28. Alternatively, instead of filling the conductive material in the entire through-hole 28, the conductive material may be filled in only an inner depth part of the through-hole 28 so that the through-hole 28 becomes a non-through hole. Thereafter, the processes of forming the thick plated film and the surface metal film in the first manufacturing process may be performed. The procedure of forming the penetration electrode 27 according to another embodiment may be applied to the penetration electrode of the submount 40 of the fourth embodiment.

(5) While the lead terminals 46 and 47 are provided on the rear surface side of the base material 41 in the submount 40 of the fourth embodiment, the lead terminals 46 and 47 for external connection may be formed on the surface side of the base material 41 and the rear surface may not include the lead terminals 46 and 47. In addition, instead of the lead terminals 46 and 47, connecter jigs for external connection may be provided in two end parts of the base material 41 to connect to the first and fourth metal electrode wires 42 and 45, respectively.

While lead terminals for external connection are not provided in the wiring board 50 of the fifth embodiment, the lead terminals may be provided on the rear surface side of the base material 51. In addition, instead of the lead terminals, connector jigs for external connection may be provided in two end parts of the base material 51 to connect to the first and fourth metal electrode wires 52 and 55, respectively.

In addition, while the submount 40 of the fourth embodiment or the wiring board 50 of the fifth embodiment exemplifies the case where three light-emitting elements 1 or three submounts 10 are mounted to configure the serial circuit of the three light-emitting elements 1 or the three submounts 10, the number of the light-emitting elements 1 or the submounts 10 to be mounted and the type of a configured circuit are not limited to those exemplified in the fourth and fifth embodiments. The element and electric circuit component mounted on the submount 40 or the wiring board 50 are not limited to the light-emitting element 1 and the submount 10.

(6) The first to third embodiments exemplify the case where the roughening process is performed on the surface side of the base material 21 if needed or the base material 21 having an unpolished and rough surface is used. In addition to or instead of that, a hole or a trench that does not reach the rear surface side of the base material 21 is preferably formed on the surface side as an anchor to a sealing resin by laser machining or the like.

(7) The fourth and fifth embodiments assume the case where the submounts 40 or the wiring boards 50 are arranged in a matrix (including a case where the submounts 40 or the wiring boards 50 are arranged only in a direction) to be integrated as a plate, thus producing an integrated wiring board body first, and the wiring board body is then cut or divided into each of the submounts 40 or the wiring boards 50 with reference to the manufacturing method of the submount 10 of the first embodiment. However, when the area of the submount 40 or the wiring board 50 is larger than the area of a base material of the wiring board body and two or more submounts 40 or wiring boards 50 cannot be arranged, a single submount 40 or a single wiring board 50 may be directly produced. In this case, there is no cutting region RC, and thus a mask part at steps A1 and A2 or at steps B1 to B3 in the second manufacturing process does not include the cutting region RC.

In the case where the mask part does not include the cutting region RC, which is not limited to the case where a single submount 40 or a single wiring board 50 is directly produced, the mask part is limited to the upper surfaces of the first to fourth metal electrode wires 42 to 45 and 52 to 55 and the mask parts have the same height. It is thus possible to employ, as the method of applying the mask material 31 at step A1 in the second manufacturing process, a method of applying the mask material 31 on a surface of a flat plate larger than the submount 40 or the wiring board 50, pressing the applied surface against the surface of the submount 40 or the wiring board 50, and transferring the mask material 31 from the surface of the plate to the mask parts on the upper surfaces of the first to fourth metal electrode wires 42 to 45 and 52 to 55. After transfer, the mask material 31 is fixed on the mask parts on the upper surfaces of the first to fourth metal electrode wires 42 to 45 and 52 to 55 by heating or irradiation of ultraviolet light. In this case, the mask material 31 preferably has a viscosity that the mask material 31 does not drip on the side wall surfaces of the first to fourth metal electrode wires 42 to 45 and 52 to 55 during transfer (1 to 100 Pa·s).

INDUSTRIAL APPLICABILITY

The base according to the present invention can be used for mounting a light-emitting diode having an emission center wavelength of approximately 365 nm or less thereon, and is effective for preventing degradation of electrical characteristics caused by a sealing resin or other resin compositions filled between electrodes of the base in an ultraviolet light-emitting operation.

DESCRIPTION OF SYMBOLS

1 nitride semiconductor ultraviolet light-emitting element
2 template
3 semiconductor laminated portion
4 p-electrode
5 n-electrode
6 protective insulating film
7 first plated electrode
8 second plated electrode
9 fluororesin film
10, 40 submount
11, 21, 41, 51 base material (insulating base material)
12 first metal electrode wire
120 first electrode pad
121 first wire part
13 second metal electrode wire
130 second electrode pad
131 third wire part
14, 15, 46, 47 lead terminal
16 fluororesin film
17 sealing resin
18 lens
20 wiring board body (insulating base material body)
22 first metal electrode wire
220 thick plated film of first metal electrode wire
221 surface metal film of first metal electrode wire
23 second metal electrode wire
230 thick plated film of second metal electrode wire
231 surface metal film of second metal electrode wire
24, 25 lead terminal
240, 250 thick plated film of lead terminal 241, 251 surface metal film of lead terminal
26, 48, 56 fluororesin film
260 coating liquid
261 base resin film
27 penetration electrode
270 thick plated film of penetration electrode
271 surface metal film of penetration electrode
28 through-hole
29 seed film
30 photosensitive sheet film
31 mask material
32 second fluororesin film
42 first metal electrode wire
420 thick plated film of first metal electrode wire
421 surface metal film of first metal electrode wire
43 second metal electrode wire
430 thick plated film of second metal electrode wire
431 surface metal film of second metal electrode wire
44 third metal electrode wire
440 thick plated film of third metal electrode wire
441 surface metal film of third metal electrode wire
45 fourth metal electrode wire
450 thick plated film of fourth metal electrode wire
451 surface metal film of fourth metal electrode wire
50 wiring board
52 first metal electrode wire
53 second metal electrode wire
54 third metal electrode wire
55 fourth metal electrode wire
RC cutting region

The invention claimed is:

1. A base for chip-on-board mounting including flip-chip mounting or for surface-mounting, the base comprising:
an insulating base material; and
two or more metal films that are formed on one side of the insulating base material and electrically separated from each other, wherein
at least a surface layer part that is exposed on a surface of the one side of the insulating base material is composed of a material that is not degraded by being exposed to ultraviolet light,
the two or more metal films are formed to include an upper surface and a side wall surface that are covered by gold or a platinum group metal, to be capable of mounting thereon one or more nitride semiconductor light-emitting elements or one or more submounts, each of the submounts being obtained by flip-chip mounting thereon a nitride semiconductor light-emitting element, and to have, as a whole, a predetermined planar view shape including two or more electrode pads,
on the one side of the insulating base material and along a boundary line between (i) an exposed surface of the insulating base material that is not covered by each of the two or more metal films and (ii) a side wall surface of each of the two or more metal films, at least a first part of the exposed surface of the insulating base material continuous with the boundary line that is sandwiched between two adjacent electrode pads and the side wall surfaces of the two or more metal films that oppose to each other with the first part interposed therebetween are covered by a fluororesin film, a height of the fluororesin film not being greater than a height of the side wall surface of each of the two or more metal films, and wherein
a part of an upper surface of each of the two or more metal films that composes at least each of the two or more electrode pads is not covered by the fluororesin film.

2. The base according to claim 1, wherein paired electrode pads of the two or more electrode pads are formed on a surface of the insulating base material so as to be electrically and physically connected to an n-electrode and a p-electrode of one of the one or more nitride semiconductor light-emitting elements or one of the one or more submounts, respectively.

3. The base according to claim 1, wherein on an exposed surface of the insulating base material exposed between paired metal films respectively including paired electrode pads of the two or more electrode pads, at least a second part in which a distance between the paired metal films is equal to or less than a maximum value of a spaced distance between the paired electrode pads and the side wall surfaces of the paired metal films that oppose to each other with the second part interposed therebetween are covered by the fluororesin film.

4. The base according to claim 1, wherein the fluororesin film includes an amorphous fluororesin composed of a polymer or a copolymer having a fluorine-containing aliphatic cyclic structure as a structural unit.

5. The base according to claim 1, wherein the fluororesin film includes a first type fluororesin where a terminal functional group of a polymer or a copolymer composing a fluororesin is a non-reactive terminal functional group that is not bondable to metal.

6. The base according to claim 1, wherein the fluororesin film is constituted by a laminated film of two or more layers, a resin film of a first layer of the laminated film that contacts each of the two or more metal films includes a second type fluororesin where a terminal functional group of a polymer or a copolymer composing a fluororesin is a reactive terminal functional group bondable to metal, and a resin film of each of second and subsequent layers of the laminated film includes a first type fluororesin where a terminal functional group of a polymer or a copolymer composing a fluororesin is a non-reactive terminal functional group that is not bondable to metal.

7. The base according to claim 1, wherein a second fluororesin film that includes a second type fluororesin where a terminal functional group of a polymer or a copolymer composing a fluororesin is a reactive terminal functional group bondable to metal is formed as a primer film of the fluororesin film on an upper surface of an outer circumferential edge part of the base.

8. A wiring board body that is configured by arranging a plurality of the bases according to claim 1 in a matrix and integrating the bases as a plate, wherein
the two or more metal films for each of the bases are periodically arranged in a matrix on an insulating base material plate that is the insulating base material, and
a cutting region is provided in a lattice shape on a boundary line between adjacent unit sections each of which corresponds to one of the bases on the insulating base material plate.

9. The wiring board body according to claim 8, wherein the fluororesin film is not formed in the cutting region.

10. A manufacturing method of a base, wherein the base comprises:
an insulating base material; and
two or more metal films that are formed on one side of the insulating base material and electrically separated from each other, wherein at least a surface layer part that is exposed on a surface of the one side of the insulating base material is composed of a material that is not degraded by being exposed to ultraviolet light, the two or more metal films are formed to include an upper surface and a side wall surface that are covered by gold or a platinum group metal, to be capable of mounting thereon one or more nitride semiconductor light-emitting elements or one or more submounts, each of the submounts being obtained by flip-chip mounting thereon a nitride semiconductor light-emitting element, and to have, as a whole, a predetermined planar view shape including two or more electrode pads, on the one side of the insulating base material and along a boundary line between (i) an exposed surface of the insulating base material that is not covered by each of the two or more metal films and (ii) a side wall surface of each of the two or more metal films, at least a first part of the exposed surface of the insulating base material continuous with the boundary line that is sandwiched between two adjacent electrode pads and the side wall surfaces of the two or more metal films that oppose to each other with the first part interposed therebetween are covered by a fluororesin film, a height of the fluororesin film not being greater than a height of the side wall surface of each of the two or more metal films, and wherein a part of an upper surface of each of the two or more metal films that composes at least each of the two or more electrode pads is not covered by the fluororesin film, and wherein the method comprises:

a first process of forming the two or more metal films on the one side of the insulating base material; and a second process in which, on the one side of the insulating base material and along the boundary line between (i) the exposed surface of the insulating base material that is not covered by each of the two or more metal films and (ii) the side wall surface of each of the two or more metal films, at least the first part of the exposed surface of the insulating base material continuous with the boundary line that is sandwiched between the two adjacent electrode pads and the side wall surfaces of the two or more metal films that oppose to each other with the first part interposed therebetween are covered by the fluororesin film.

11. The manufacturing method of a base according to claim 10, wherein the second process includes forming a first mask material that blocks formation of the fluororesin film on a part of an upper surface of each of the two or more metal films that composes at least each of the two or more electrode pads, applying a coating liquid that contains a fluororesin composing the fluororesin film on the one side of the insulating base material having the first mask material formed thereon, and drying the coating liquid to form a film of the fluororesin, and then removing the first mask material and a part of the film of the fluororesin formed on the first mask material.

12. The manufacturing method of a base according to claim 11, wherein the first mask material is composed of a resin composition that does not contain a fluororesin, and the second process includes dissolving the first mask material by an organic solvent that does not dissolve the fluororesin film and removing the first mask material.

13. The manufacturing method of a base according to claim 10, wherein the second process includes applying a coating liquid that contains a fluororesin composing the fluororesin film on the one side of the insulating base material, and drying the coating liquid to form a film of the fluororesin, and then removing a part of the film of the fluororesin formed on an upper surface of each of the two or more metal films by polishing.

14. The manufacturing method of a base according to claim 10, wherein the first process includes periodically arranging the two or more metal films for each of the bases in a matrix on an insulating base material plate that is the insulating base material, and the second process includes forming a second mask material that blocks formation of the fluororesin film on a cutting region formed in a lattice shape and provided on a boundary line between adjacent unit sections each of which corresponds to one of the bases on the insulating base material plate, applying a coating liquid that contains a fluororesin composing the fluororesin film on the one side of the insulating base material having the second mask material formed thereon, and drying the coating liquid to form a film of the fluororesin, and then removing the second mask material and a part of the film of the fluororesin formed on the second mask material.

15. The manufacturing method of a base according to claim 10, wherein the first process includes periodically arranging the two or more metal films for each of the bases in a matrix on an insulating base material plate that is the insulating base material, and the second process includes forming a second mask material that blocks formation of the fluororesin film at least on a cutting region formed in a lattice shape and provided on a boundary line between adjacent unit sections each of which corresponds to one of the bases on the insulating base material plate and a part of an upper surface of each of the two or more metal films that composes at least each of the two or more electrode pads, applying a coating liquid that contains a fluororesin composing the fluororesin film on the one side of the insulating base material having the second mask material formed thereon, and drying the coating liquid to form a film of the fluororesin, and then removing the second mask material and a part of the film of the fluororesin formed on the second mask material.

16. The manufacturing method of a base according to claim 14, wherein the second mask material is composed of a resin composition that does not contain a fluororesin, and the second process includes dissolving the second mask material by an organic solvent that does not dissolve the fluororesin film and removing the second mask material.

17. The manufacturing method of a base according to claim 10, wherein the first process includes periodically arranging the two or more metal films for each of the bases in a matrix on an insulating base material plate that is the insulating base material, and the manufacturing method further comprises, between the first process and the second process, forming a second fluororesin film that includes a second type fluororesin where a terminal functional group of a polymer or a copolymer composing a fluororesin is a reactive terminal functional group bondable to metal as a primer film of the fluororesin film on the cutting region and a side region of the cutting region or a side region of the cutting region.

18. The manufacturing method of a base according to claim 14, further comprising, after the second process, cutting or dividing the insulating base material plate along the cutting region into each of the bases.

19. A base for chip-on-board mounting including flip-chip mounting or for surface-mounting, the base comprising:
   an insulating base material; and
   two or more metal films that are formed on one side of the insulating base material and electrically separated from each other, wherein
   at least a surface layer part that is exposed on a surface of the one side of the insulating base material is composed of a material that is not degraded by being exposed to ultraviolet light,
   the two or more metal films are formed to include an upper surface and a side wall surface that are covered by gold or a platinum group metal, to be capable of mounting thereon one or more nitride semiconductor light-emitting elements or one or more submounts, each of the submounts being obtained by flip-chip mounting thereon a nitride semiconductor light-emitting element, and to have, as a whole, a predetermined planar view shape including two or more electrode pads,
   on the one side of the insulating base material and along a boundary line between (i) an exposed surface of the insulating base material that is not covered by each of the two or more metal films and (ii) a side wall surface of each of the two or more metal films, at least a first part of the exposed surface of the insulating base material continuous with the boundary line that is sandwiched between two adjacent electrode pads and the side wall surfaces of the two or more metal films that oppose to each other with the first part interposed therebetween are covered by a fluororesin film, a thickness of the fluororesin film not being greater than a height of the side wall surface of each of the two or more metal films, and wherein
   a part of an upper surface of each of the two or more metal films that composes at least each of the two or more electrode pads is not covered by the fluororesin film.

* * * * *